United States Patent
Kumar et al.

(10) Patent No.: US 7,498,066 B2
(45) Date of Patent: Mar. 3, 2009

(54) PLASMA-ASSISTED ENHANCED COATING

(75) Inventors: Devendra Kumar, Rochester Hills, MI (US); Satyendra Kumar, Troy, MI (US)

(73) Assignee: BTU International Inc., N. Billerica, MA (US)

( * ) Notice: Subject to any disclaimer, the term of this patent is extended or adjusted under 35 U.S.C. 154(b) by 747 days.

(21) Appl. No.: 10/513,393

(22) PCT Filed: May 7, 2003

(86) PCT No.: PCT/US03/14124

§ 371 (c)(1),
(2), (4) Date: May 23, 2005

(87) PCT Pub. No.: WO03/095699

PCT Pub. Date: Nov. 20, 2003

(65) Prior Publication Data

US 2006/0078675 A1 Apr. 13, 2006

Related U.S. Application Data

(60) Provisional application No. 60/435,278, filed on Dec. 23, 2002, provisional application No. 60/430,677, filed on Dec. 4, 2002, provisional application No. 60/378,693, filed on May 8, 2002.

(51) Int. Cl.
*H05H 1/46* (2006.01)
(52) U.S. Cl. ............................ 427/569; 427/575
(58) Field of Classification Search .............. 427/569, 427/575, 248.1, 572
See application file for complete search history.

(56) References Cited

U.S. PATENT DOCUMENTS

| 3,432,296 A | 3/1969 | McKinnon et al. |
| 3,612,686 A | 10/1971 | Braman et al. |
| 3,731,047 A | 5/1973 | Mullen et al. |
| 4,004,934 A | 1/1977 | Prochazka |

(Continued)

FOREIGN PATENT DOCUMENTS

DE 222 348 A1 5/1985

(Continued)

OTHER PUBLICATIONS

Accentus Corporate Overview, 3 pages—http://www.accentus.co.uk/ipco/html/techenv6_txt_fr.html (2003).

(Continued)

*Primary Examiner*—Timothy H Meeks
*Assistant Examiner*—Elizabeth Burkhart
(74) *Attorney, Agent, or Firm*—Weingarten, Schurgin, Gagnebin & Lebovici LLP

(57) ABSTRACT

Methods and apparatus are provided for igniting, modulating, and sustaining a plasma (615) for coating objects (250). In one embodiment, a method of coating a surface of an object (250) includes forming a plasma (615) in a cavity (230) by subjecting a gas to electromagnetic radiation in the presence of a plasma catalyst (240) and adding at least one coating material (510) to the plasma (615) by energizing the material (510) with, for example, a laser (500). The material (510) is allowed to deposit on the surface of the object (250) to form a coating. Various types of plasma (240) catalysts are also provided.

26 Claims, 8 Drawing Sheets

U.S. PATENT DOCUMENTS

| | | | |
|---|---|---|---|
| 4,025,818 A | 5/1977 | Giguere et al. | |
| 4,090,055 A | 5/1978 | King | |
| 4,147,911 A | 4/1979 | Nishitani | |
| 4,151,034 A | 4/1979 | Yamamoto et al. | |
| 4,213,818 A | 7/1980 | Lemons et al. | |
| 4,230,448 A | 10/1980 | Ward et al. | |
| 4,265,730 A | 5/1981 | Hirose et al. | |
| 4,307,277 A | 12/1981 | Maeda et al. | |
| 4,339,326 A | 7/1982 | Hirose et al. | |
| 4,404,456 A | 9/1983 | Cann | |
| 4,473,736 A | 9/1984 | Bloyet et al. | |
| 4,479,075 A | 10/1984 | Elliott | |
| 4,500,564 A | 2/1985 | Enomoto | |
| 4,504,007 A | 3/1985 | Anderson, Jr. et al. | |
| 4,609,808 A | 9/1986 | Bloyet et al. | |
| 4,611,108 A | 9/1986 | Leprince et al. | |
| 4,624,738 A | 11/1986 | Westfall et al. | |
| 4,664,937 A | 5/1987 | Ovshinsky et al. | |
| 4,666,775 A | 5/1987 | Kim et al. | |
| 4,687,560 A | 8/1987 | Tracy | |
| 4,698,234 A | 10/1987 | Ovshinsky | |
| 4,760,230 A | 7/1988 | Hassler | |
| 4,767,902 A | 8/1988 | Palaith et al. | |
| 4,772,770 A | 9/1988 | Matsui et al. | |
| 4,792,348 A | 12/1988 | Pekarsky | |
| 4,840,139 A | 6/1989 | Takei | |
| 4,871,581 A | 10/1989 | Yamazaki | |
| 4,877,589 A | 10/1989 | O'Hare | |
| 4,877,938 A | 10/1989 | Rau et al. | |
| 4,883,570 A | 11/1989 | Efthimion et al. | |
| 4,888,088 A | 12/1989 | Slomowitz | |
| 4,891,488 A | 1/1990 | Davis et al. | |
| 4,897,285 A | 1/1990 | Wilhelm | |
| 4,908,492 A | 3/1990 | Okamoto et al. | |
| 4,919,077 A | 4/1990 | Oda et al. | |
| 4,924,061 A | 5/1990 | Labat et al. | |
| 4,946,547 A | 8/1990 | Palmour et al. | |
| 4,956,590 A | 9/1990 | Phillips | |
| 4,963,709 A | 10/1990 | Kimrey, Jr. | |
| 4,972,799 A | 11/1990 | Misumi et al. | |
| 5,003,152 A | 3/1991 | Matsuo | |
| 5,010,220 A | 4/1991 | Apte et al. | |
| 5,017,404 A | 5/1991 | Paquet et al. | |
| 5,023,056 A | 6/1991 | Aklufi et al. | |
| 5,058,527 A | 10/1991 | Ohta et al. | |
| 5,072,650 A | 12/1991 | Phillips | |
| 5,074,112 A | 12/1991 | Walton et al. | |
| 5,085,885 A | 2/1992 | Foley et al. | |
| 5,087,272 A | 2/1992 | Nixdorf | |
| 5,103,715 A | 4/1992 | Phillips | |
| 5,120,567 A | 6/1992 | Frind et al. | |
| 5,122,633 A | 6/1992 | Moshammer et al. | |
| 5,131,993 A | 7/1992 | Suib et al. | |
| 5,164,130 A | 11/1992 | Holcombe et al. | |
| 5,202,541 A | 4/1993 | Patterson et al. | |
| 5,223,308 A | 6/1993 | Doehler | |
| 5,224,117 A | 6/1993 | Kruger et al. | |
| 5,227,695 A | 7/1993 | Pelletier et al. | |
| 5,271,963 A | 12/1993 | Eichman et al. | |
| 5,276,297 A | 1/1994 | Nara | |
| 5,276,386 A | 1/1994 | Watanabe et al. | |
| 5,277,773 A | 1/1994 | Murphy | |
| 5,284,544 A | 2/1994 | Mizutani et al. | |
| 5,304,766 A | 4/1994 | Baudet et al. | |
| 5,307,892 A | 5/1994 | Phillips | |
| 5,310,426 A | 5/1994 | Mori | |
| 5,311,906 A | 5/1994 | Phillips | |
| 5,316,043 A | 5/1994 | Phillips | |
| 5,321,223 A | 6/1994 | Kimrey, Jr. et al. | |
| 5,349,154 A | 9/1994 | Harker et al. | |
| 5,366,764 A | 11/1994 | Sunthankar | |
| 5,370,525 A | 12/1994 | Gordon | |
| 5,423,180 A | 6/1995 | Nobue et al. | |
| 5,435,698 A | 7/1995 | Phillips | |
| 5,449,887 A | 9/1995 | Holcombe et al. | |
| 5,505,275 A | 4/1996 | Phillips | |
| 5,514,217 A | 5/1996 | Niino et al. | |
| 5,520,740 A | 5/1996 | Kanai et al. | |
| 5,521,360 A | 5/1996 | Johnson et al. | |
| 5,523,126 A | 6/1996 | Sano et al. | |
| 5,527,391 A | 6/1996 | Echizen et al. | |
| 5,536,477 A | 7/1996 | Cha et al. | |
| 5,587,205 A * | 12/1996 | Saito et al. | 427/553 |
| 5,597,456 A | 1/1997 | Maruyama et al. | |
| 5,607,509 A | 3/1997 | Schumacher et al. | |
| 5,616,373 A | 4/1997 | Karner et al. | |
| 5,645,897 A | 7/1997 | Andra | |
| 5,651,825 A * | 7/1997 | Nakahigashi et al. | 118/723 ME |
| 5,662,965 A | 9/1997 | Deguchi et al. | |
| 5,670,065 A | 9/1997 | Bickmann et al. | |
| 5,671,045 A | 9/1997 | Woskov et al. | |
| 5,682,745 A | 11/1997 | Phillips | |
| 5,689,949 A | 11/1997 | DeFreitas et al. | |
| 5,712,000 A | 1/1998 | Wei et al. | |
| 5,714,010 A | 2/1998 | Matsuyama et al. | |
| 5,715,677 A | 2/1998 | Wallman et al. | |
| 5,734,501 A | 3/1998 | Smith | |
| 5,735,451 A | 4/1998 | Mori et al. | |
| 5,741,364 A | 4/1998 | Kodama et al. | |
| 5,755,097 A | 5/1998 | Phillips | |
| 5,794,113 A | 8/1998 | Munir et al. | |
| 5,795,628 A * | 8/1998 | Wisard et al. | 427/566 |
| 5,796,080 A | 8/1998 | Jennings et al. | |
| 5,808,282 A | 9/1998 | Apte et al. | |
| 5,828,338 A | 10/1998 | Gerstenberg | |
| 5,841,237 A | 11/1998 | Alton | |
| 5,847,355 A | 12/1998 | Barmatz et al. | |
| 5,848,348 A | 12/1998 | Dennis | |
| 5,859,404 A | 1/1999 | Wei et al. | |
| 5,868,871 A | 2/1999 | Yokose et al. | |
| 5,874,705 A * | 2/1999 | Duan | 219/121.43 |
| 5,904,993 A | 5/1999 | Takeuchi et al. | |
| 5,939,026 A | 8/1999 | Seki et al. | |
| 5,945,351 A | 8/1999 | Mathuni | |
| 5,961,773 A | 10/1999 | Ichimura et al. | |
| 5,961,871 A | 10/1999 | Bible et al. | |
| 5,973,289 A | 10/1999 | Read et al. | |
| 5,976,429 A | 11/1999 | Chen et al. | |
| 5,980,843 A | 11/1999 | Silversand | |
| 5,980,999 A | 11/1999 | Goto et al. | |
| 5,989,477 A | 11/1999 | Berger | |
| 5,993,612 A | 11/1999 | Rostaing et al. | |
| 5,998,774 A | 12/1999 | Joines et al. | |
| 6,011,248 A | 1/2000 | Dennis | |
| 6,028,393 A * | 2/2000 | Izu et al. | 315/111.01 |
| 6,038,854 A | 3/2000 | Penetrante et al. | |
| 6,054,693 A | 4/2000 | Barmatz et al. | |
| 6,054,700 A | 4/2000 | Rokhvarger et al. | |
| 6,096,389 A | 8/2000 | Kanai | |
| 6,101,969 A | 8/2000 | Niori et al. | |
| 6,103,068 A | 8/2000 | Merten et al. | |
| 6,122,912 A | 9/2000 | Phillips | |
| 6,131,386 A | 10/2000 | Trumble | |
| 6,132,550 A | 10/2000 | Shiomi | |
| 6,149,985 A | 11/2000 | Grace et al. | |
| 6,152,254 A | 11/2000 | Phillips | |
| 6,153,868 A | 11/2000 | Marzat | |
| 6,183,689 B1 | 2/2001 | Roy et al. | |
| 6,186,090 B1 | 2/2001 | Dotter, II et al. | |
| 6,189,482 B1 | 2/2001 | Zhao et al. | |
| 6,204,606 B1 | 3/2001 | Spence et al. | |
| 6,224,836 B1 | 5/2001 | Moisan et al. | |
| 6,228,773 B1 | 5/2001 | Cox | |
| 6,238,629 B1 | 5/2001 | Barankova et al. | |

| | | | | | | |
|---|---|---|---|---|---|---|
| 6,248,206 | B1 | 6/2001 | Herchen et al. | JP | 62-000535 A | 1/1987 |
| 6,264,812 | B1 | 7/2001 | Raaijmakers et al. | JP | 04-74858 | 3/1992 |
| 6,284,202 | B1 | 9/2001 | Cha et al. | JP | 06-345541 A | 12/1994 |
| 6,287,430 | B1 * | 9/2001 | Matsumoto et al. .... 204/192.26 | JP | 07-153405 A | 6/1995 |
| 6,287,980 | B1 | 9/2001 | Hanazaki et al. | JP | 08-217558 A | 8/1996 |
| 6,287,988 | B1 | 9/2001 | Nagamine et al. | JP | 08-281423 A | 10/1996 |
| 6,297,172 | B1 | 10/2001 | Kashiwagi | JP | 09-017597 A | 1/1997 |
| 6,297,595 | B1 | 10/2001 | Stimson et al. | JP | 09-023458 A | 1/1997 |
| 6,329,628 | B1 | 12/2001 | Kuo et al. | JP | 09-027459 A | 1/1997 |
| 6,342,195 | B1 | 1/2002 | Roy et al. | JP | 09-027482 A | 1/1997 |
| 6,345,497 | B1 | 2/2002 | Penetrante | JP | 09-078240 A | 3/1997 |
| 6,348,158 | B1 | 2/2002 | Samukawa | JP | 09-102400 A | 4/1997 |
| 6,358,361 | B1 | 3/2002 | Matsumoto | JP | 09-102488 A | 4/1997 |
| 6,362,449 | B1 | 3/2002 | Hadidi et al. | JP | 09-111461 A | 4/1997 |
| 6,365,885 | B1 | 4/2002 | Roy et al. | JP | 09-137274 A | 5/1997 |
| 6,367,412 | B1 | 4/2002 | Ramaswamy et al. | JP | 09-157048 A | 6/1997 |
| 6,370,459 | B1 | 4/2002 | Phillips | JP | 09-223596 A | 8/1997 |
| 6,372,304 | B1 | 4/2002 | Sano et al. | JP | 09-235686 A | 9/1997 |
| 6,376,027 | B1 | 4/2002 | Lee et al. | JP | 09-251971 A | 9/1997 |
| 6,383,333 | B1 | 5/2002 | Haino et al. | JP | 09-295900 A | 11/1997 |
| 6,383,576 | B1 | 5/2002 | Matsuyama | JP | 10-066948 A | 3/1998 |
| 6,388,225 | B1 | 5/2002 | Blum et al. | JP | 10-081588 A | 3/1998 |
| 6,392,350 | B1 | 5/2002 | Amano | JP | 10-081970 A | 3/1998 |
| 6,407,359 | B1 | 6/2002 | Lagarde et al. | JP | 10-087310 A | 4/1998 |
| 6,488,112 | B1 | 12/2002 | Kleist | JP | 10-204641 A | 8/1998 |
| 6,512,216 | B2 | 1/2003 | Gedevanishvili et al. | JP | 10-259420 A | 9/1998 |
| 6,522,055 | B2 | 2/2003 | Uemura et al. | JP | 10-294306 A | 11/1998 |
| 6,575,264 | B2 | 6/2003 | Spadafora | JP | 11-031599 A | 2/1999 |
| 6,592,664 | B1 | 7/2003 | Frey et al. | JP | 11-106947 A | 4/1999 |
| 6,610,611 | B2 | 8/2003 | Liu et al. | JP | 11-145116 A | 5/1999 |
| 6,712,298 | B2 | 3/2004 | Kohlberg et al. | JP | 11-186222 A | 7/1999 |
| 6,717,368 | B1 | 4/2004 | Sakamoto et al. | JP | 11-228290 A | 8/1999 |
| 6,870,124 | B2 | 3/2005 | Kumar et al. | JP | 11-265885 A | 9/1999 |
| 2001/0027023 | A1 | 10/2001 | Ishihara et al. | JP | 11-273895 A | 10/1999 |
| 2001/0028919 | A1 | 10/2001 | Liu et al. | JP | 11-297266 A | 10/1999 |
| 2002/0034461 | A1 | 3/2002 | Segal | JP | 2000-012526 A | 1/2000 |
| 2002/0036187 | A1 | 3/2002 | Ishll et al. | JP | 2000-173989 A | 6/2000 |
| 2002/0104483 | A1 * | 8/2002 | Misiano et al. ............. 118/726 | JP | 2000-203990 A | 7/2000 |
| 2002/0124867 | A1 | 9/2002 | Kim et al. | JP | 2000-269182 A | 9/2000 |
| 2002/0135308 | A1 | 9/2002 | Janos et al. | JP | 2000-288382 A | 10/2000 |
| 2002/0140381 | A1 | 10/2002 | Golkowski et al. | JP | 2000-306901 A | 11/2000 |
| 2002/0190061 | A1 | 12/2002 | Gerdes et al. | JP | 2000-310874 A | 11/2000 |
| 2002/0197882 | A1 | 12/2002 | Niimi et al. | JP | 2000-310876 A | 11/2000 |
| 2003/0071037 | A1 | 4/2003 | Sato et al. | JP | 2000-317303 A | 11/2000 |
| 2003/0111334 | A1 | 6/2003 | Dodelet et al. | JP | 2000-323463 A | 11/2000 |
| 2003/0111462 | A1 | 6/2003 | Sato et al. | JP | 2000-348897 A | 12/2000 |
| 2004/0001295 | A1 | 1/2004 | Kumar et al. | JP | 2001-013719 A | 1/2001 |
| 2004/0004062 | A1 | 1/2004 | Kumar et al. | JP | 2001-053069 A | 2/2001 |
| 2004/0070347 | A1 | 4/2004 | Nishida et al. | JP | 2001-058127 A | 3/2001 |
| 2004/0089631 | A1 | 5/2004 | Blalock et al. | JP | 2001-093871 A | 4/2001 |
| 2004/0107796 | A1 | 6/2004 | Kumar et al. | JP | 2001-149754 A | 6/2001 |
| 2004/0107896 | A1 | 6/2004 | Kumar et al. | JP | 2001-149918 A | 6/2001 |
| 2004/0118816 | A1 | 6/2004 | Kumar et al. | JP | 2001-196420 A | 7/2001 |
| | | | | JP | 2001-303252 A | 10/2001 |
| | | FOREIGN PATENT DOCUMENTS | | JP | 2001-332532 A | 11/2001 |
| | | | | JP | 2001-351915 A | 12/2001 |
| DE | | 195 42 352 A1 | 5/1997 | JP | 2002-022135 A | 1/2002 |
| DE | | 100 05 146 A1 | 8/2001 | JP | 2002-028487 A | 1/2002 |
| EP | | 0 335 675 A2 | 10/1989 | JP | 2002-069643 A | 3/2002 |
| EP | | 0 228 864 B1 | 3/1991 | JP | 2002-075960 A | 3/2002 |
| EP | | 0 420 101 A2 | 4/1991 | JP | 2002-126502 A | 5/2002 |
| EP | | 0 435 591 A | 7/1991 | JP | 2002-273161 A | 9/2002 |
| EP | | 0 436 361 A1 | 7/1991 | JP | 2002-273168 A | 9/2002 |
| EP | | 435591 * | 7/1991 | JP | 2003-075070 A | 3/2003 |
| EP | | 0 520 719 B1 | 5/1996 | JP | 2003-264057 A | 9/2003 |
| EP | | 0 670 666 B1 | 6/1998 | WO | WO 95-11442 A1 | 4/1995 |
| EP | | 0 724 720 B1 | 5/2000 | WO | WO 96/06700 A1 | 3/1996 |
| EP | | 1 093 846 A1 | 4/2001 | WO | WO 96/38311 A1 | 12/1996 |
| EP | | 1 427 265 A2 | 6/2004 | WO | WO 97/13141 A1 | 4/1997 |
| JP | | 56-140021 A2 | 11/1981 | WO | WO 01-55487 A2 | 8/2001 |
| JP | | 57-119164 A2 | 7/1982 | WO | WO 01-58223 A1 | 8/2001 |
| JP | | 58-025073 A | 2/1983 | WO | WO 01-82332 A1 | 11/2001 |
| JP | | 59-169053 A | 9/1984 | WO | WO 02-26005 A1 | 3/2002 |

| | | |
|---|---|---|
| WO | WO 02-061165 A1 | 8/2002 |
| WO | WO 02-061171 A1 | 8/2002 |
| WO | WO 02-062114 A1 | 8/2002 |
| WO | WO 02-062115 A1 | 8/2002 |
| WO | WO 02-067285 A2 | 8/2002 |
| WO | WO 02-067285 A3 | 8/2002 |
| WO | WO 03-018862 A2 | 3/2003 |
| WO | WO 03-018862 A3 | 3/2003 |
| WO | WO 03-028081 A2 | 4/2003 |
| WO | WO 03-095058 A2 | 11/2003 |
| WO | WO 03-095089 A1 | 11/2003 |
| WO | WO 03-095090 A1 | 11/2003 |
| WO | WO 03-095130 A1 | 11/2003 |
| WO | WO 03-095591 A1 | 11/2003 |
| WO | WO 03-095699 A1 | 11/2003 |
| WO | WO 03-095807 A1 | 11/2003 |
| WO | WO 03-096369 A1 | 11/2003 |
| WO | WO 03-096370 A1 | 11/2003 |
| WO | WO 03-096380 A2 | 11/2003 |
| WO | WO 03-096381 A2 | 11/2003 |
| WO | WO 03-096382 A2 | 11/2003 |
| WO | WO 03-096383 A2 | 11/2003 |
| WO | WO 03-096747 A2 | 11/2003 |
| WO | WO 03-096749 A1 | 11/2003 |
| WO | WO 03-096766 A1 | 11/2003 |
| WO | WO 03-096768 A1 | 11/2003 |
| WO | WO 03-096770 A1 | 11/2003 |
| WO | WO 03-096771 A1 | 11/2003 |
| WO | WO 03-096772 A1 | 11/2003 |
| WO | WO 03-096773 A1 | 11/2003 |
| WO | WO 03-096774 A1 | 11/2003 |
| WO | WO 2004-050939 A2 | 6/2004 |

OTHER PUBLICATIONS

Agrawal et al., "Grain Growth Control in Microwave Sintering of Ultrafine WC-Co Composite Powder Compacts," Euro PM99 Conference, Sintering, Turino, Italy, 8 pages (1999).

Agrawal, "Metal Parts from Microwaves," *Materials World* 7(11):672-673 (1999).

Agrawal et al., "Microwave Sintering of Commercial WC/Co Based Hard Metal Tools," Euro PM99 Conference, Sintering, Turino, Italy, 8 pages (1999).

Agrawal, "Microwave Processing of Ceramics," *Current Opinion in Solid State and Materials Science* 3:480-485 (Oct. 1998).

Air Liquide, "Heat Treatment—Gas Quenching,"—http://www.airliquide.com/en/business/industry/metals/applications/heat_treatment/quenching.asp, 1 page (2000).

Alexander et al., "Electrically Conductive Polymer Nanocomposite Materials," AFRL's Materials and Manufacturing Directorate, Non-metallic Materials Division, Polymer Branch, Wright-Patterson AFB OH—http://www.afrlhorizons.com/Briefs/Sept02/ML0206.html , 2 pages (Sep. 2002).

Al-Shamma'a et al., "Microwave Atmospheric Plasma for Cleaning Exhaust Gases and Particulates," Future Car Congress, Washington, Jun. 3-5, 2002 (1 page).

Alton et al., "A High-Density, RF Plasma-Sputter Negative Ion Source," The 8th Intl. Conf. on Heavy-Ion Accelerator Technology, Argonne Natl. Lab., Oct. 5-9, 1998, Poster Presentation (3 pages).

Anklekar et al., "Microwave Sintering and Mechanical Properties of PM Copper Steel," *Powder Metallurgy* 44(4):355-362 (2001).

Batanov et al., "Plasmachemical Deposition of Thin Films in a Localized Free-Space Microwave Discharge," *Technical Physics* 38(6):475-479 (Jun. 1993).

"Carbonitriding," Treat All Metals, Inc., 2 pages—http://www.treatallmetals.com/carbon.htm.

"Carburizing," Treat All Metals, Inc.—http://www.treatallmetals.com/gas.htm, 2 pages.

Cheng, J., "Fabricating Transparent Ceramics by Microwave Sintering," *Am. Ceramic Soc. Bull.* 79(9):71-74 (2000).

Cheng et al., "Microwave Processing of WC-Co Composites And Ferroic Titanates" *Mat. Res. Innovat.* 1(1):44-52 (Jun. 1997).

Circle Group Holdings, Inc., "StarTech Environmental Corp."—http://www.crgq.com/cgiweb/HTML/eMentor_Companies/startech.html, 9 pages.

"Classification of Cast Iron"—Key to Steel—Article—http://www.key-to-steel.com/Articles/Art63.htm, 3 pages (1999).

Collin, in: *Foundations for Microwave Engineering*, 2d Ed., IEEE Press, NY, pp. 180-192 (2001).

"Controlled Atmospheres Sinter-Hardening,," Sarnes Ingenieure, 2 pages, http://www.space-ctrl.de/de/2002/06/399.php (2002).

Egashira et al., "Decomposition of Trichloroethylene by Microwave-Induced Plasma Generated from SiC Whiskers," *J. Electrochem. Soc.*, 145(1):229-235 (Jan. 1998).

Ford 1.3L Catalytic Converter (1988-1989) product description—http://catalyticconverters.com/FO13L43778889.html, 1 page, undated.

Ford Contour Catalytic Converter (1995-1996) product description—http://www.all-catalytic-converters.com/ford-contour-converter.html, 2 pages, undated.

Fraunhofer ILT, "Plasma-Reactors for Aftertreatment of Automobile Exhaust Gas," Fraunhofer-Gesellschaft—http://www.ilt.fhg.de/eng/jb01-s35.html, 1 page (2002).

French, "The Plasma Waste Converter—From Waste Disposal to Energy Creation," The International Chemical Weapon Demilitarization Conference, Gifu City, Japan (May 22-24, 2001)—http://www.arofe.army.mil/Conferences/CWC2001/French.htm, 1 page.

Gao et al., "Superfast Densification of Oxide/Oxide Ceramic Composites," *J. Am. Ceram. Soc.* 82(4)1061-1063 (1999).

Gedevanishvili et al., "Microwave Combustion Synthesis And Sintering of Intermetallics and Alloys," *J. Mat. Sci. Lett.* 18(9):665-668 (1999).

General Eastern, "Semiconductor Manufacturing—Using the HygroTwin 2850 to Reduce Costs, Improve Quality;", 3 pages, www.generaleastern.net (1997).

George, "The Catalytic Converter," 5 pages, (2002)—http://krioma.net/articles/Catalytic%20Converter/Catalytic%20Converter.htm.

GlassTesseract.Org website, "Tech Procedures and Tips: Exhaust Manifolds and Catalytic Converters Removal—and Installation", 4 pages (2003). http://www.glasstesseract.org/tech/catalytic.html.

*Hackh's Chemical Dictionary*, 3rd edition, J. Grant, Ed., McGraw Hill Book Co., NY, pp. 174-175 (1944).

"Heat Treatment of Steels—The Processes," AZoM.com, 9 pages, (2002)—www.azom.com.

"Power Metallurgy—Overview of the Powder Metallurgy Process," AZoM.com, 3 pages (2002)—http://www.azom.com/details.asp?ArticleID=1414.

Honda Automobile News Press Release, "Honda Introduces Its First Two Clean Air Vehicles, the Civic Ferio LEV and Partner 1.6 LEV," 3 pages (Feb. 1997)—http://world.honda.com/news/1997/4970217a.html.

Honda Civic CX Catalytic Converter, (1996-2000) 1 page—http://www.catalyticconverters.com/HOCIVICCX4349600.html, undated.

"How A Blast Furnace Works—The Blast Furnace Plant," AISI Learning Center, 7 pages. http://www.steel.org/learning/howmade/blast_furnace.htm., undated.

"How Is Steel Made," Answer Discussion, 6 pages—http://ourworld.compuserve.com/homepages/Dyaros/stlmanuf.htm, undated.

Hsu et al., "Palladium-Coated Kieselguhr for Simultaneous Separation and Storage of Hydrogen," Westinghouse Savannah River Company, U.S. Dept. of Commerce, National Technical Information Service, 14 pages (2001).

Fincke, "Hydrogen Separation Membrane,—Advanced Gas Separation: H2 Separation," Summary of research proposal, 1 page (2003).

"IRC in Materials Processing: Advanced Melting, Atomisation, Powder and Spray Forming, Plasma Melting—Operation of a Plasma Furnace," University of Birmingham website, 3 pages—http://www.irc.bham.ac.uk/theme1/plasma/furnace.htm, undated.

Saville, in: *Iron and Steel*, Chapter 6, pp. 16-22, Wayland Publ., England (1976).

Japanese Advanced Environment Equipment, "Mitsubishi Graphite Electrode Type Plasma Furnace," 3 pages, Undated—http://nett21.unep.or.jp/JSIM_DATA/WASTE/WASTE_3/html/Doc_467.html.

Johnson, Faculty Biography webpage, Dept. of Materials Science & Engineering, Northwestern University, 2 pages—http://www.matsci.northwestern.edu/faculty/ dlj.html, undated.

Kalyanaraman et al., "Synthesis and Consolidation of Iron Nanopowders," *NanoStructured Materials* 10(8):1379-1392 (1998).

Karger, Scientific Staff Research Areas for KTP Company, 2 pages (Nov. 2002)—http://wwwfb10.upb.de/KTP/KTP-ENG/Staff/Karger/body_karger.html.

Kong et al., "Nuclear-Energy-Assisted Plasma Technology for Producing Hydrogen," Nuclear Energy Research Initiative Research Proposal, 4 pages (2002).

Lewis, in: *Hawley's Condensed Chemical Dictionary*, 12th ed., pp. 230-232, Van Nostrand Reinhold, NY (1993).

Lucas, "Welding Using Microwave Power Supplies," Faculty webpage, 1 page—http://www.liv.ac.uk/EEE/research/cer/project6.htm, undated.

Luggenholscher et al., "Investigations on Electric Field Distributions in a Microwave Discharge in Hydrogen," Institute fur Laser- und Plasmaphysik, Univistat Essen, Germany, 4 pages, undated.

March Plasma Systems, product descriptions,2 pages (2002)—http://www.marchplasma.com/micro_app.htm, undated.

"Micro-fabricated Palladium-Silver Membrane for Hydrogen Separation and Hydro/Dehydrogenation Reactions," Research Education Group webpage, 5 pages—http://utep.el.utwente.nl/tt/projects/sepmem/—undated.

Ahmed et al., "Microwave Joining of Alumina and Zirconia Ceramics," IRIS Research Topics 1998, 1 page (1988).

"Microwave Welding," EWi WeldNet, 1 page—(2003) http://www.ferris.edu/cot/accounts/plastics/ htdocs/Prey/Microwave%20Homepage.htm.

"Microwave Welding of Plastics," TWI World Centre for Materials Joining Technoloy, 2 pages, (Aug. 2002)—http://www.twi.co.uk/j32k/protected/band_3/ksab001.htm.

"Microwave Welding," Welding and Joining Information Network, 3 pages (Nov. 2002)—http://www.ewi.org/technologies/plastics/microwave.asp.

Moss et al., "Experimental Investigation of Hydrogen Transport Through Metals," Experiment Description, Los Alamos National Library, 5 pages—Undated. http://www.education.lanl.gov/RESOURCES/h2/dye/education.html.

"Nitriding," Treat All Metals, Inc., 2 pages—Undated—http://www.treatallmetals.com/nitrid.htm.

Thomas et al., "Non-Thermal Plasma Aftertreatment of Particulates—Theoretical Limits and Impact on Reactor Design," SAE Spring Fuels and Lubes Conference, Paris, France, 27 pages—Jun. 19-22, 2000—http://www.aeat.co.uk/electrocat/sae/saepaper.htm.

"Using Non-Thermal Plasma Reactor to Reduce NOx Emissions from CIDI Engines," Office of Energy Efficiency and Renewable Energy, Office of Transportation, 1 page (Apr. 1999).

"Optoelectronic Packaging Applications," March Plasma Systems, Product Description, 2 pages (2002)—http://www.marchplasma.com/opto_app.htm.

Paglieri et al., "Palladium Alloy Composite Membranes for Hydrogen Separation," 15th Annual Conf. Fossil Energy Matter, Knoxville, TN (2001), 5 pages.

Peelamedu et al., "Anisothermal Reaction Synthesis of Garnets, Ferrites, and Spinels In Microwave Field," *Materials Research Bulletin* 36:2723-2739 (Dec. 2001).

PerfectH2 PE8000 Series Product Description, Palladium Diffusion Hydrogen Purifier For High Flow Rate MOCVD Applications, Matheson Tri.Gas, 2 pages (2002).

Photonics Directory, Definition for Thyratron, (Laurin Publishing), 2 pages http://www.photonics.com/dictionary/.

Pingel, "About What Every P/A Should Know About P/M," Powder Metallurgy Co., 9 pages—http://www.powdermetallurgyco.com/pm_about.htm.

"Plasma Applications," Coalition for Plasma Science, 2 pages (1999, 2000)—http://www.plasmacoalition.org/applications.htm.

"Plasma Carburizing," 1 page—Undated, http://www.ndkinc.co.jp/ndke04.html.

"Plasma Direct Melting Furnace," Materials Magic, Hitachi Metals Ltd., 3 pages—Undated, http://www.hitachi-metals.co.jp/e/prod/prod07/p07_2_02.html.

"Classical Plasma Applications," 2 pages (2002)—http://www.plasma.iinpe.br/English/Classical_Applications.htm.

"Plasma Nitride Process Description," Northeast Coating Technologies, 2 pages, Undated, www.northeastcoating.com.

Plasma Science and Technology, "Plasma for Home, Business and Transportation," 4 pages—Undated. http://www.plasmas.org/rot-home.htm.

"Novel Plasma Catalysts Significantly Reduce NOx from Diesel Engines," US Department of Energy research summary, 2 pages (Apr. 2001)—http://www.ott.doe.gov/success.html.

"Printed Circuit Board (PCB) Plasma Applications," March Plasma Systems product descriptions, 2 pages (2002)—http://www.marchplasma.com/pcb_app.01.htm.

Roy et al., "Definitive Experimental Evidence for Microwave Effects: Radically New Effects of Separated E and H Fields, Such As Decrystallization of Oxides in Seconds," *Materials Research Innovations* 6(3):129-140 (2002).

Roy et al., "Full Sintering of Powdered-Metal Bodies In A Microwave Field," *Nature* 399:668-670 (Jun. 17, 1999).

Roy et al., "Major phase transformations and magnetic property changes caused by electromagnetic fields at microwave frequencies," *J. Mat. Res.* 17(12):3008-3011 (2002).

Roy et al., "Microwave Processing: Triumph of Applications-Driven Science in WC-Composites And Ferroic Titanates," *Ceramic Transactions* 80:3-26, (1997).

Rusanov, Introduction to the Hydrogen Energy & Plasma Technologies Institute: Russian Research Centre Kurchatov Institute, 13 pages, Undated—http://www.kiae.ru/eng/str/ihept/oiivept.htm.

Samant et al., "Glow Discharge Plasma Nitriding of Al 6063 Samples and Study of Their Surface Hardness," *Metallofiz. Noveishe Tekhnol.* 23(3):325-333 (2001).

Sato et al., "Surface Modification of Pure Iron by rf Plasma Nitriding with dc Bias Voltage Impression," *Hyomen Gijutsu* 48(3):317-323 (1997) (English Abstract).

Saveliev et al., "Effect of Cathode End Caps and a Cathode Emissive Surface on Relativistic Magnetron Operation," *IEEE Transactions on Plasma Science* 28:3.478-484 (Jun. 2000).

SC/Tetra Engine Manifold Application, 2 pages (2001)—http://www.sctetra.com/applications/01_manifold.htm.

Shulman, "Microwaves In High-Temperature Processes," GrafTech Intl. Ltd., 8 pages (Mar. 2003) http://www.industrialheating.com/CDA/ArticleInformation/features/BNP_Features_Item/0,2832,94035,00.html.

Slone et al., "NOx Reduction For Lean Exhaust Using Plasma Assisted Catalysis," Noxtech Inc., 5 pages (2000)—http://www.osti.gov/fcvt/deer2000/bhattpa.pdf.

Stockwell Rubber Company, Inc., "Conductive Silicone Rubber Compounds Product Selection Guide," Electrically Conducive Materials Chart, 3 pages, Undated—http://www.stockwell.com/electrically_conducive_produc.htm.

Sumitomo Heavy Industries, Ltd., "Spark Plasma Sintering," 3 pages (2001)—http://www.shi.co.jp/sps/eng/.

"Surface Hardening" Services Description for AHS Corp., 5 pages, Undated—http://www.ahscorp.com/surfaceh.html.

Takizawa et al. "Synthesis of inorganic materials by 28 GHz Microwave Irradiation," *Transactions of the Materials Research Society of Japan* 27(1):51-54 (2002).

Taube et al., "Advances in Design of Microwave Resonance Plasma Source," American Institute of Chemical Engineering, 2004 Annual Meeting, Presentation (Nov. 2004).

"testMAS: Pressure Sintering," 11 pages, Undated—http://cybercut.berkley.edu/mas2/processes/sinter_pressure.

Wolf et al., "The Amazing Metal Sponge: Simulations of Palladium-Hydride," 2 pages, Undated—http://www.psc.edu/science/Wolf/Wolf.html.

Toyota Motor Sales, "Emission Sub Systems—Catalytic Converter," 10 pages, undated.

Uchikawa et al., "New Technique of Activating Palladium Surface for Absorption of Hydrogen or Deuterium," *Japanese J. Appl. Phys.* 32:5095-5096, Part 1, No. 11A (Nov. 1993).

Wang et al., "Densification of Al$_2$O$_3$ Powder Using Spark Plasma Sintering," *J. Mater. Res.*, 15(4):982-987 (Apr. 2000).

Way et al., "Palladium/Copper Alloy Composite Membranes for High Temperature Hydrogen Separation from Coal-Derived Gas Streams," Research Grant Report, Dept. of Chemical Engineering, Colorado School of Mines, 3 pages (1999).

Lucas, "Welding Breakthrough: Generating and Handling a Microwave Powered Plasma," Australian Industry News, Information & Suppliers, 7 pages (Sep. 2001)—http://www.industry/search.com/au/features/microwave.asp.

"Welding Plastic Parts," Business New Published Company, 4 pages (Nov. 2000)—http://www.assemblymag.com/Common/print_article.asp?rID=E455512C17534C31B96D.

Xie et al., "Effect of Rare Earths in Steels on the Thermochemical Treatments and the Functional Mechanisms of the Rare Earths," *Rare Metals Materials and Engineering* 26(1):52-55 (Feb. 1997) (English Abstract).

Yahoo Canada—Autos, "Catalytic Converter Answer2," 4 pages (2001)—http://ca.autos.yahoo.com/maintain/catalytic_converteranswer2.html.

International Search Report issued on Jul. 23, 2003, in PCT/US03/14037.

International Search Report issued on Aug. 15, 2003, in PCT/US03/14124.

International Search Report issued on Sep. 10, 2003, in PCT/US03/14132.

International Search Report issued on Aug. 14, 2003, in PCT/US03/14052.

International Search Report issued on Aug. 14, 2003, in PCT/US03/14054.

International Search Report issued on May 10, 2004, in PCT/US03/14036.

International Search Report issued on Aug. 9, 2003, in PCT/US03/14053.

International Search Report issued on Feb. 25, 2004, in PCT/US03/14034.

International Search Report issued on Sep. 19, 2003, in PCT/US03/14039.

International Search Report issued on Aug. 29, 2003, in PCT/US03/14038.

International Search Report issued on Dec. 30, 2003, in PCT/US03/14133.

International Search Report issued on Aug. 28, 2003, in PCT/US03/14035.

International Search Report issued on Jul. 29, 2003, in PCT/US03/14040.

International Search Report issued on Sep. 10, 2003, in PCT/US03/14134.

International Search Report issued on Aug. 29, 2003, in PCT/US03/14122.

International Search Report issued on Sep. 30, 2003, in PCT/US03/14130.

International Search Report issued on May 24, 2004, in PCT/US03/14055.

International Search Report issued on May 26, 2004, in PCT/US03/14137.

International Search Report issued on Aug. 29, 2003, in PCT/US03/14123.

International Search Report issued on Aug. 29, 2003, in PCT/US03/14121.

International Search Report issued on Sep. 16, 2003, in PCT/US03/14136.

International Search Report issued on May 25, 2004, in PCT/US03/14135.

Written Opinion issued on Apr. 13, 2004, in PCT/US03/014037.

Examination Report issued on Feb. 24, 2004, in PCT/US03/14054.

Written Opinion issued on Dec. 22, 2003, in PCT/US03/14053.

Examination Report issued on Apr. 26, 2004, in PCT/US03/14053.

Written Opinion issued on Dec. 22, 2003, in PCT/US03/14123.

Examination Report issued on Apr. 26, 2004, in PCT/US03/14123.

Quayle Action issued on Apr. 19, 2004, in U.S. Appl. No. 10/430,414.

Office Action issued on May 18, 2004, in U.S. Appl. No. 10/430,426.

Reply to Office Action filed on Nov. 18, 2004, in U.S. Appl. No. 10/430,426.

Office Action issued on Feb. 24, 2005, in U.S. Appl. No. 10/430,426.

Willert-Porada, M., "Alternative Sintering Methods" 1 page Abstract dated Nov. 8, 2001, http://www.itap.physik.uni-stuttgart.de/~gkig/neu/english/welcome.php?/~gkig/neu/abstracts/abstract_willert-porada.html.

* cited by examiner

PLASMA-ASSISTED ENHANCED COATING

CROSS-REFERENCE OF RELATED APPLICATIONS

Priority is claimed to U.S. Provisional Patent Application No. 60/378,693, filed May 8, 2002, No. 60/430,677, filed Dec. 4, 2002, and No. 60/435,278, filed Dec. 23, 2002, all of which are fully incorporated herein by reference.

FIELD OF THE INVENTION

This invention relates to methods and apparatus for enhanced plasma-assisted coating, and particularly for coating one or more objects using an electromagnetic radiation-induced plasma with a plasma catalyst and an energized coating material.

BACKGROUND

Conventional plasma-assisted coating processes normally involve igniting a plasma in a partial vacuum, for example, during magnetron or radio-frequency sputter deposition. In some instances, material-processing flexibility is limited because of the fixed shape and size of the sputter deposition chamber and the need to maintain a vacuum seal. When coating large parts, large containers have been required, but such containers can make it difficult to maintain a reliable vacuum, which can significantly increase costs and slow down the process speed. Thus, vacuum integrity and the object size can affect efficiency and throughput during a plasma-assisted coating process.

Another plasma-assisted coating method is plasma spray deposition. During this method, material is reportedly deposited on a surface by compounding a buildup of "splats" of molten material on the surface. The heat of the plasma either melts or vaporizes material injected into path of the plasma ejected from a nozzle, and the material impinges on the surface of a work piece at high velocity. Typical coatings that have been reported by this method are thermal barrier coatings and oxide coatings. However, when coating an object with raised or depressed surface features, or an object with a complex shape, such as a gear or fan blade, the object must be positioned and appropriately rotated in the path of the plasma spray produced by a focused nozzle. Also, plasma spray deposition typically requires expensive equipment and can only be used on a limited range of materials because of the relatively high heat and thermal shock inherent in this technique.

BRIEF SUMMARY OF A FEW ASPECTS OF THE INVENTION

Methods and apparatus for coating a surface area of an object can be provided. In one embodiment, a catalyzed coating plasma can be formed in a cavity by subjecting a gas to an amount of electromagnetic radiation in the presence of a plasma catalyst, placing at least one coating material in a position that is separate from the plasma and in fluid communication with it, energizing at least a portion of the at least one coating material so that the energized portion can be added to the plasma, and allowing the at least one coating material to deposit on the surface area of the object to form a coating.

In another embodiment, a material deposition system for fabricating coatings is provided. The system can include a first vessel in which a first cavity is formed, an electromagnetic radiation source coupled to the cavity such that the electromagnetic radiation source can direct electromagnetic radiation into the first cavity during the deposition process, a gas source coupled to the first cavity so that a gas can flow into the cavity during the deposition process, an energy source configured to energize at least one coating material placed in communication with or in the cavity so that the energized portion can be added to the plasma, and at least one plasma catalyst in the presence of the radiation (e.g., located either in the first cavity, near the first cavity, or in and near the first cavity).

Plasma catalysts for initiating, modulating, and sustaining plasmas can also be provided. The plasma catalyst may be passive or active. A passive plasma catalyst can include any object capable of inducing a plasma by deforming a local electric field (e.g., an electromagnetic field) consistent with this invention, without necessarily adding additional energy. An active plasma catalyst can be any particle or high energy wave packet capable of transferring a sufficient amount of energy to a gaseous atom or molecule to remove at least one electron from the gaseous atom or molecule in the presence of electromagnetic radiation. In both the passive and active cases, a plasma catalyst can improve, or relax, the environmental conditions required to ignite a coating plasma.

Additional plasma catalysts, and methods and apparatus for igniting, modulating, and sustaining a plasma for enhanced coating of objects consistent with this invention are also provided.

BRIEF DESCRIPTION OF THE DRAWINGS

Further aspects of the invention will be apparent upon consideration of the following detailed description, taken in conjunction with the accompanying drawings, in which like reference characters refer to like parts throughout, and in which.

DETAILED DESCRIPTION OF THE EMBODIMENTS

This invention can relate to methods and apparatus for initiating, modulating, and sustaining a plasma for a variety of enhanced coating applications, including, for example, generating high temperatures for heat-treating, synthesizing and depositing carbides, nitrides, borides, oxides, and other materials, as well as for applications that relate to manufacturing of coated objects, such as automobile or other vehicular components.

This invention can be used for controllable plasma-assisted coating processes that may lower energy costs and increase deposition efficiency and manufacturing flexibility.

One coating method consistent with this invention can include adding a gas, a plasma catalyst, and electromagnetic radiation to a cavity for catalyzing a coating plasma. As used herein, any plasma formed with a plasma catalyst for the purpose of coating one or more objects is a "catalyzed coating plasma," or more simply, "a coating plasma." The catalyst can be passive or active. A passive plasma catalyst can include any object capable of inducing a plasma by deforming a local electric field (e.g., an electromagnetic field) consistent with this invention without necessarily adding additional energy through the catalyst, such as by applying a voltage to create a spark. An active plasma catalyst, on the other hand, may be any particle or high energy wave packet capable of transferring a sufficient amount of energy to a gaseous atom or molecule to remove at least one electron from the gaseous atom or molecule, in the presence of electromagnetic radiation.

The following commonly owned, concurrently filed U.S. patent applications are hereby incorporated by reference in their entireties: U.S. patent application Ser. No. 10/513,221, PCT Application U.S. 03/14132, now expired, U.S. patent application Ser. No. 10/513,394, U.S. patent application Ser. No. 10/513,305, U.S. patent application Ser. No. 10/513,607, U.S. patent application Ser. No. 10/449,600, PCT Application U.S. 03/14034, now expired, U.S. patent application Ser, No. 10/430,416, U.S. patent application Ser. No. 10/430,415, PCT Application U.S. 03/14133, now expired, U.S. patent application Ser. No. 10/513,606, U.S. patent application Ser. No. 10/513,309, U.S. patent application Ser. No. 10/513,220, PCT Application U.S. 03/14122, U.S. patent application Ser. No. 10/513,397, U.S. patent application Ser. No. 10/513,605, PCT Application U.S. 03/14137, now expired, U.S. patent application Ser. No. 10/430,426, PCT Application U.S. 03/14121, now expired, U.S. patent application Ser. No. 10/513,604, and PCT Application U.S. 03/14135, now expired.

Illustrative Plasma System

Figure 1:
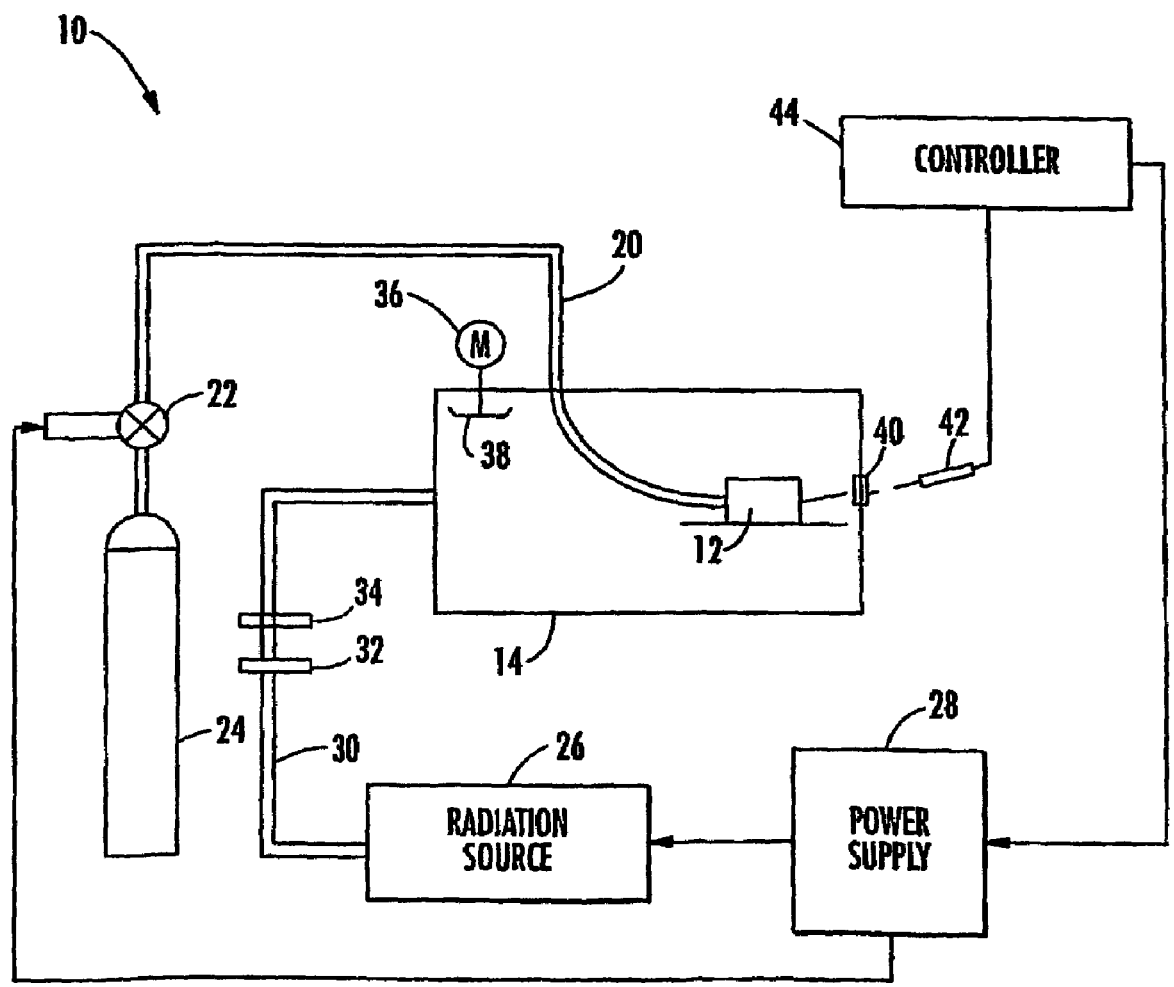
FIG. 1 shows a schematic diagram of an illustrative plasma coating system consistent with this invention.

FIG. 1 shows illustrative plasma system 10 consistent with one aspect of this invention. In this embodiment, cavity 12 is formed in a vessel that is positioned inside electromagnetic radiation chamber (i.e., applicator) 14. In another embodiment (not shown), vessel 12 and electromagnetic radiation chamber 14 are the same, thereby eliminating the need for two separate components. The vessel in which cavity 12 is formed can include one or more electromagnetic radiation-transmissive insulating layers to improve its thermal insulation properties without significantly shielding cavity 12 from the electromagnetic radiation.

In one embodiment, cavity 12 is formed in a vessel made of ceramic. Due to the extremely high temperatures that can be achieved with plasmas consistent with this invention, the upper temperature limit for processing is restricted only by the melting point of the ceramic used to make the vessel. In one experiment, for example, a ceramic capable of withstanding about 3,000 degrees Fahrenheit was used. For example, the ceramic material can include, by weight, 29.8% silica, 68.2% alumina, 0.4% ferric oxide, 1% titania, 0.1% lime, 0.1% magnesia, 0.4% alkalis, which is sold under Model No. LW-30 by New Castle Refractories Company, of New Castle, Pa. It will be appreciated by those of ordinary skill in the art, however, that other materials, such as quartz, and those different (e.g., those having higher melting temperatures) from the ceramic material described above, can also be used consistent with the invention.

In one successful experiment, a plasma was formed in a partially open cavity inside a first brick and topped with a second brick. The cavity had dimensions of about 2 inches by about 2 inches by about 1.5 inches. At least two holes were also provided in the brick in communication with the cavity: one for viewing the plasma and at least one hole for providing the gas. The size of the cavity can depend on the desired plasma process being performed. Also, the cavity should at least be configured to prevent the plasma from rising/floating away from the primary processing region, even though the plasma may not contact the object being coated.

Cavity 12 can be connected to one or more gas sources 24 (e.g., a source of argon, nitrogen, hydrogen, xenon, krypton, etc.) by line 20 and control valve 22, which may be powered by power supply 28. Line 20 may be tubing (e.g., between about 1/16 inch and about 1/4 inch, such as about 1/8"), but could be any device capable of supplying gas. Also, if desired, a vacuum pump can be connected to the chamber to remove any undesirable fumes that may be generated during plasma processing. In one embodiment, gas can flow in and/or out of cavity 12 through one or more gaps in a multi-part vessel. Thus, gas ports consistent with this invention need not be distinct holes and can take on other forms as well, such as many small distributed holes.

A radiation leak detector (not shown) was installed near source 26 and waveguide 30 and connected to a safety interlock system to automatically turn off the electromagnetic radiation power supply if a leak above a predefined safety limit, such as one specified by the FCC and/or OSHA (e.g., 5 mW/cm$^2$), was detected.

Electromagnetic radiation source 26, which can be powered by electrical power supply 28, directs electromagnetic radiation into chamber 14 through one or more waveguides 30. It will be appreciated by those of ordinary skill in the art that electromagnetic source 26 can be connected directly to chamber 14 or cavity 12, thereby eliminating waveguide 30. The electromagnetic radiation entering chamber 14 or cavity 12 is used to ignite a plasma within the cavity. This catalyzed plasma can be substantially modulated or sustained and confined to the cavity by coupling additional electromagnetic radiation with the catalyst.

Electromagnetic radiation can be supplied through circulator 32 and tuner 34 (e.g., 3-stub tuner). Tuner 34 can be used to minimize the reflected power as a function of changing ignition or processing conditions, especially before the catalyzed plasma has formed because electromagnetic radiation will be strongly absorbed by the plasma after its formation.

As explained more fully below, the location of electromagnetic radiation-transmissive cavity 12 in chamber 14 may not be critical if chamber 14 supports multiple modes, and especially when the modes are continually or periodically mixed. As also explained more fully below, motor 36 can be connected to mode-mixer 38 for making the time-averaged electromagnetic radiation energy distribution substantially uniform throughout chamber 14. Furthermore, window 40 (e.g., a quartz window) can be disposed in one wall of chamber 14 adjacent to cavity 12, permitting temperature sensor 42 (e.g., an optical pyrometer) to be used to view a process inside cavity 12. In one embodiment, the optical pyrometer output can increase from zero volts as the temperature rises to within the tracking range. The pyrometer can be used to sense radiant intensities at two or more wavelengths and to fit those intensities using Planck's law to determine the temperature of the work piece. The pyrometer can also establish the temperature of a species present in the plasma by monitoring its excited state population distribution from the emission intensities at two discrete transitions.

Sensor 42 can develop output signals as a function of the temperature or any other monitorable condition associated with a work piece (not shown) within cavity 12 and provide the signals to controller 44. Dual temperature sensing and heating, as well as automated cooling rate and gas flow controls can also be used. Controller 44 in turn can be used to control operation of power supply 28, which can have one output connected to electromagnetic radiation source 26 as described above and another output connected to valve 22 to control gas flow into cavity 12.

The invention has been practiced with equal success employing electromagnetic radiation sources at both 915 MHz and 2.45 GHz, provided by Communications and Power Industries (CPI), although radiation having any frequency less than about 333 GHz can be used. The 2.45 GHz system provided continuously variable electromagnetic radiation power from about 0.5 kilowatts to about 5.0 kilowatts. Consistent with one embodiment of the present invention, the electromagnetic radiation power density during deposition may be between about 0.05 W/cm$^3$ and about 100 W/cm$^3$. For example, about 2.5 W/cm$^3$ was successfully used. A 3-stub tuner allowed impedance matching for maximum power transfer and a dual directional coupler was used to measure forward and reflected powers. Also, optical pyrometers were used for remote sensing of the work piece temperature.

As mentioned above, radiation having any frequency less than-about 333 GHz can be used consistent with this invention. For example, frequencies, such as power line frequencies (about 50 Hz to about 60 Hz), can be used, although the pressure of the gas from which the plasma is formed may be lowered to assist with plasma ignition. Also, any radio frequency or microwave frequency can be used consistent with this invention, including frequencies greater than about 100 kHz. In most cases, the gas pressure for such relatively high frequencies need not be lowered to ignite, modulate, or sustain a plasma, thereby enabling many plasma-processes to occur at atmospheric pressures and above.

The equipment was computer controlled using LabVIEW® 6i software, which provided real-time temperature monitoring and electromagnetic radiation power control. LabVIEW® graphical development environment was used to automate data acquisition, instrument control, measurement analysis, and data presentation. LabVIEW® is available from the National Instruments Corporation, of Austin, Tex.

Noise was reduced by using sliding averages of suitable number of data points. Also, to improve speed and computational efficiency, the number of stored data points in the buffer array were limited by using shift-registers and buffer-sizing. The pyrometer measured the temperature of a sensitive area of about 1 cm$^2$, which was used to calculate an average temperature. The pyrometer sensed radiant intensities at two wavelengths and fit those intensities using Planck's law to determine the temperature. It will be appreciated, however, that other devices and methods for monitoring and controlling temperature are also available and can be used consistent with this invention. Control software that can be used consistent with this invention is described, for example, in commonly owned, concurrently filed PCT Application U.S. 03/14135, now expired, which is hereby incorporated by reference in its entirety.

Chamber 14 had several glass-covered viewing ports with electromagnetic radiation shields and one quartz window for pyrometer access. Several ports for connection to a vacuum pump and a gas source were also provided, although not necessarily used.

System 10 also included a closed-loop de-ionized water cooling system (not shown) with an external heat exchanger cooled by tap water. During operation, the de-ionized water first cooled the magnetron, then the load-dump in the circulator (used to protect the magnetron), and finally the electromagnetic radiation chamber through water channels welded on the outer surface of the chamber.

Plasma Catalysts

As mentioned previously, a plasma catalyst consistent with this invention can include one or more different materials and may be either passive or active. A plasma catalyst can be used, among other things, to ignite, modulate, and/or sustain a coating plasma at a gas pressure that is less than, equal to, or greater than atmospheric pressure.

One method of forming a plasma consistent with this invention can include subjecting a gas in a cavity to electromagnetic radiation having a frequency less than about 333 GHz in the presence of a passive plasma catalyst. A passive plasma catalyst consistent with this invention can include any object capable of inducing a plasma by deforming a local electric field (e.g., an electromagnetic field) consistent with this invention, without necessarily adding additional energy through the catalyst, such as by applying an electric voltage to create a spark.

A passive plasma catalyst consistent with this invention can also be a nano-particle or a nano-tube. As used herein, the term "nano-particle" can include any particle having a maximum physical dimension less than about 100 nm that is at least electrically semi-conductive. Also, both single-walled and multi-walled carbon nanotubes, doped and undoped, can be particularly effective for igniting plasmas consistent with this invention because of their exceptional electrical conductivity and elongated shape. The nanotubes can have any convenient length and can be a powder fixed to a substrate. If fixed, the nanotubes can be oriented randomly on the surface of the substrate or fixed to the substrate (e.g., at some predetermined orientation) while the plasma is ignited or sustained.

A passive plasma catalyst can also be a powder consistent with this invention, and need not be made of nano-particles or nano-tubes. It can be formed, for example, from fibers, dust particles, flakes, sheets, etc. When in powder form, the catalyst can be suspended, at least temporarily, in a gas. By suspending the powder in the gas, the powder can be quickly dispersed throughout the cavity and more easily consumed, if desired.

Figure 1A:
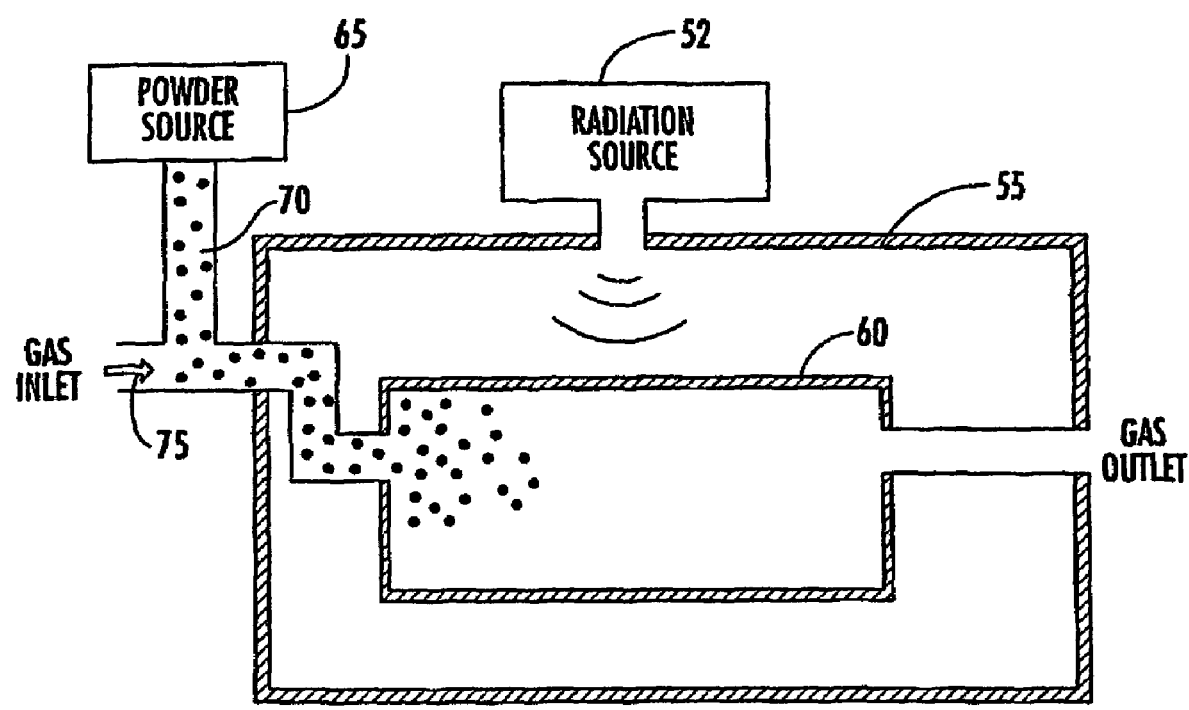
FIG. 1A shows an illustrative embodiment of a portion of a plasma coating system for adding a powder plasma catalyst to a plasma cavity for igniting, modulating, or sustaining a plasma in a cavity consistent with this invention.

In one embodiment, the powder catalyst can be carried into the cavity and at least temporarily suspended with a carrier gas. The carrier gas can be the same or different from the gas that forms the plasma. Also, the powder can be added to the gas prior to being introduced to the cavity. For example, as shown in FIG. 1A, electromagnetic radiation source 52 can supply radiation to electromagnetic radiation cavity 55, in which plasma cavity 60 is placed. Powder source 65 provides catalytic powder 70 into gas stream 75. In an alternative embodiment, powder 70 can be first added to cavity 60 in bulk (e.g., in a pile) and then distributed in the cavity in any number of ways, including flowing a gas through or over the bulk powder. In addition, the powder can be added to the gas for igniting, modulating, or sustaining a coating plasma by moving, conveying, drizzling, sprinkling, blowing, or otherwise, feeding the powder into or within the cavity.

In one experiment, a coating plasma was ignited in a cavity by placing a pile of carbon fiber powder in a copper pipe that extended into the cavity. Although sufficient electromagnetic (microwave) radiation was directed into the cavity, the copper pipe shielded the powder from the radiation and no plasma ignition took place. However, once a carrier gas began flowing through the pipe, forcing the powder out of the pipe and into the cavity, and thereby subjecting the powder to the electromagnetic radiation, a plasma was nearly instantaneously ignited in the cavity.

A powder plasma catalyst consistent with this invention can be substantially non-combustible, thus it need not contain oxygen, or burn in the presence of oxygen. Thus, as mentioned above, the catalyst can include a metal, carbon, a carbon-based alloy, a carbon-based composite, an electrically conductive polymer, a conductive silicone elastomer, a polymer nanocomposite, an organic-inorganic composite, and any combination thereof.

Also, powder catalysts can be substantially uniformly distributed in the plasma cavity (e.g., when suspended in a gas), and plasma ignition can be precisely controlled within the cavity. Uniform ignition can be important in certain applications, including those applications requiring brief plasma exposures, such as in the form of one or more bursts. Still, a certain amount of time can be required for a powder catalyst to distribute itself throughout a cavity, especially in complicated, multi-chamber cavities. Therefore, consistent with another aspect of this invention, a powder catalyst can be introduced into the cavity through a plurality of ignition ports to more rapidly obtain a more uniform catalyst distribution therein (see below).

In addition to powder, a passive plasma catalyst consistent with this invention can include, for example, one or more microscopic or macroscopic fibers, sheets, needles, threads, strands, filaments, yarns, twines, shavings, slivers, chips, woven fabrics, tape, whiskers, or any combination thereof, In these cases, the plasma catalyst can have at least one portion with one physical dimension substantially larger than another physical dimension. For example, the ratio between at least two orthogonal dimensions should be at least about 1:2, but could be greater than about 1:5, or even greater than about 1:10.

Thus, a passive plasma catalyst can include at least one portion of material that is relatively thin compared to its length. A bundle of catalysts (e.g., fibers) may also be used and can include, for example, a section of graphite tape. In one experiment, a section of tape having approximately thirty thousand strands of graphite fiber, each about 2-3 microns in diameter, was successfully used. The number of fibers in and the length of a bundle are not critical to igniting, modulating, or sustaining the plasma. For example, satisfactory results have been obtained using a section of graphite tape about one-quarter inch long. One type of carbon fiber that has been successfully used consistent with this invention is sold under the trademark Magnamite®, Model No. AS4C-GP3K, by the Hexcel Corporation of Salt Lake City, Utah. Also, silicon-carbide fibers have been successfully used.

A passive plasma catalyst consistent with another aspect of this invention can include one or more portions that are, for example, substantially spherical, annular, pyramidal, cubic, planar, cylindrical, rectangular or elongated.

The passive plasma catalysts discussed above include at least one material that is at least electrically semi-conductive. In one embodiment, the material can be highly conductive., For example, a passive plasma catalyst consistent with this invention can include a metal, an inorganic material, carbon, a carbon-based alloy, a carbon-based composite, an electrically conductive polymer, a conductive silicone elastomer, a polymer nanocomposite, an organic-inorganic composite, or any combination thereof. Some of the possible inorganic materials that can be included in the plasma catalyst include carbon, silicon carbide, molybdenum, platinum, tantalum, tungsten, carbon nitride, and aluminum, although other electrically conductive inorganic materials are believed to work just as well.

In addition to one or more electrically conductive materials, a passive plasma catalyst consistent with this invention can include one or more additives (which need not be electrically conductive). As used herein, the additive can include any material that a user wishes to add to the plasma. For example, in doping semiconductors and other materials, one or more dopants can be added to the plasma through the catalyst. See, e.g., commonly owned, concurrently filed U.S. patent application Ser. No. 10/513,397, which is hereby incorporated by reference in its entirety. The catalyst can include the dopant itself, or it can include a precursor material that, upon decomposition, can form the dopant. Thus, the plasma catalyst can include one or more additives and one or more electrically conductive materials in any desirable ratio, depending on the ultimate desired composition of the plasma and the process using the plasma.

The ratio of the electrically conductive components to the additives in a passive plasma catalyst can vary over time while being consumed. For example, during ignition, the plasma catalyst could desirably include a relatively large percentage of electrically conductive components to improve the ignition conditions. On the other hand, if used while sustaining the plasma, the catalyst could include a relatively large percentage of additives. It will be appreciated by those of ordinary skill in the art that the component ratio of the plasma catalyst used to ignite and sustain the plasma could be the same and that the ratio can be customized to deposit any desired coating composition.

A predetermined ratio profile can be used to simplify many plasma processes. In many conventional plasma processes, the components within the plasma are added as necessary, but such addition normally requires programmable equipment to add the components according to a predetermined schedule. However, consistent with this invention, the ratio of components in the catalyst can be varied, and thus the ratio of components in the plasma itself can be automatically varied. That is, the ratio of components in the plasma at any particular time can depend on which of the catalyst portions is currently being consumed by the plasma. Thus, the catalyst component ratio can be different at different locations within the catalyst.

And, the current ratio of components in a plasma can depend on the portions of the catalyst currently and/or previously consumed, especially when the flow rate of a gas passing through the plasma chamber is relatively slow.

Figure 2:
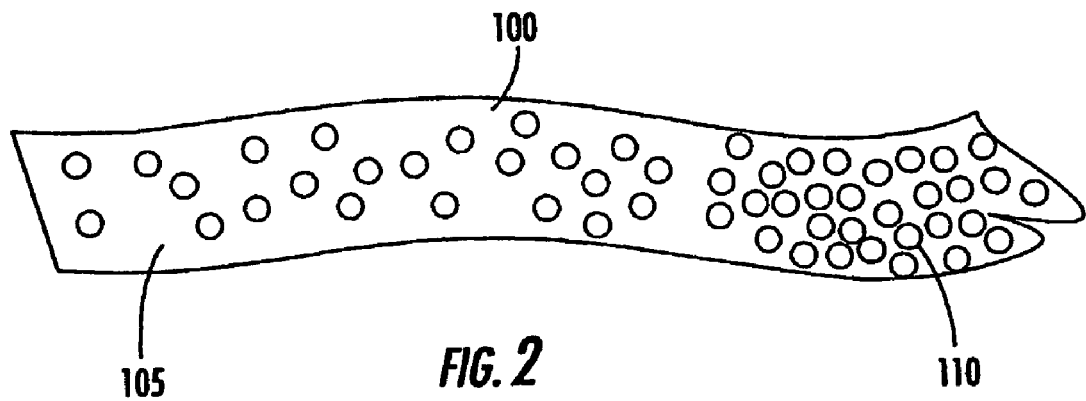
FIG. 2 shows an illustrative plasma catalyst fiber with at least one component having a concentration gradient along its length consistent with this invention.

A passive plasma catalyst consistent with this invention can be homogeneous, inhomogeneous, or graded. Also, the plasma catalyst component ratio can vary continuously or discontinuously throughout the catalyst. For example, in FIG. 2, the ratio can vary smoothly forming a gradient along a length of catalyst 100. Catalyst 100 can include a strand of material that includes a relatively low concentration of a component at section 105 and a continuously increasing concentration toward section 110.

Figure 3:
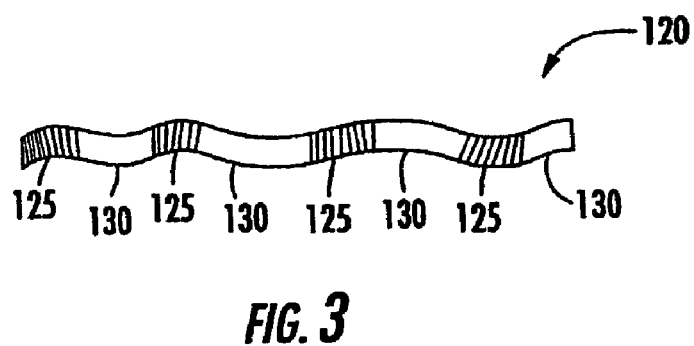
FIG. 3 shows an illustrative plasma catalyst fiber with multiple components at a ratio that varies along its length consistent with this invention.

Alternatively, as shown in FIG. 3, the ratio can vary discontinuously in each portion of catalyst 120, which includes, for example, alternating sections 125 and 130 having different concentrations. It will be appreciated that catalyst 120 can have more than two section types. Thus, the catalytic component ratio being consumed by the plasma can vary in any predetermined fashion. In one embodiment, when the plasma is monitored and a particular additive is detected, further processing can be automatically commenced or terminated.

Another way to vary the ratio of components in a sustained plasma is by introducing multiple catalysts having different component ratios at different times or different rates. For example, multiple catalysts can be introduced at approximately the same location or at different locations within the cavity. When introduced at different locations, the plasma formed in the cavity can have a component concentration gradient determined by the locations of the various catalysts. Thus, an automated system can include a device by which a consumable plasma catalyst is mechanically inserted before and/or during plasma igniting, modulating, and/or sustaining.

Figure 4:
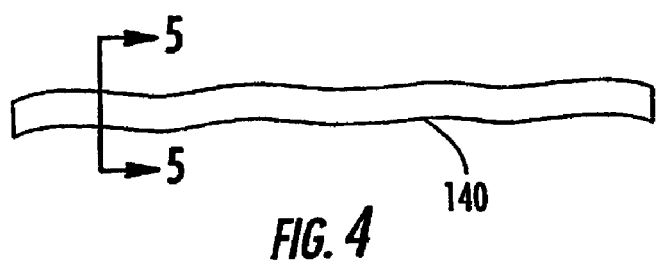
FIG. 4 shows another illustrative plasma catalyst fiber that includes a core under layer and a coating consistent with this invention.
Figure 5:
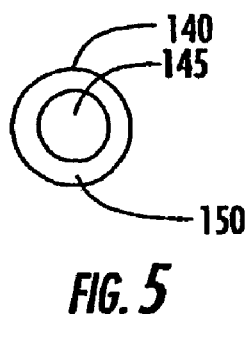
FIG. 5 shows a cross-sectional view of the plasma catalyst fiber of FIG. 4, taken from line 5-5 of FIG. 4, consistent with this invention.

A passive plasma catalyst consistent with this invention can also be coated. In one embodiment, a catalyst can include a substantially non-electrically conductive coating deposited on the surface of a substantially electrically conductive material. Alternatively, the catalyst can include a substantially electrically conductive coating deposited on the surface of a substantially electrically non-conductive material. FIGS. 4 and 5, for example, show fiber 140, which includes under layer 145 and coating 150. In one embodiment, a plasma catalyst including a carbon core is coated with nickel to prevent oxidation of the carbon.

A single plasma catalyst can also include multiple coatings. If the coatings are consumed during contact with the plasma, the coatings could be introduced into the plasma sequentially, from the outer coating to the innermost coating, thereby creating a time-release mechanism. Thus, a coated plasma catalyst can include any number of materials, as long as a portion of the catalyst is at least electrically semi-conductive.

Consistent with another embodiment of this invention, a plasma catalyst can be located entirely within an electromagnetic radiation chamber to substantially reduce or prevent electromagnetic radiation energy leakage. In this way, the plasma catalyst does not electrically or magnetically couple with the radiation chamber, the vessel containing the cavity, or to any electrically conductive object outside the cavity. This can prevent sparking at the ignition port and prevents electromagnetic radiation from leaking outside the chamber during the ignition and possibly later if the plasma is sustained. In one embodiment, the catalyst can be located at a tip of a substantially electrically non-conductive extender that extends through an ignition port.

Figure 6:
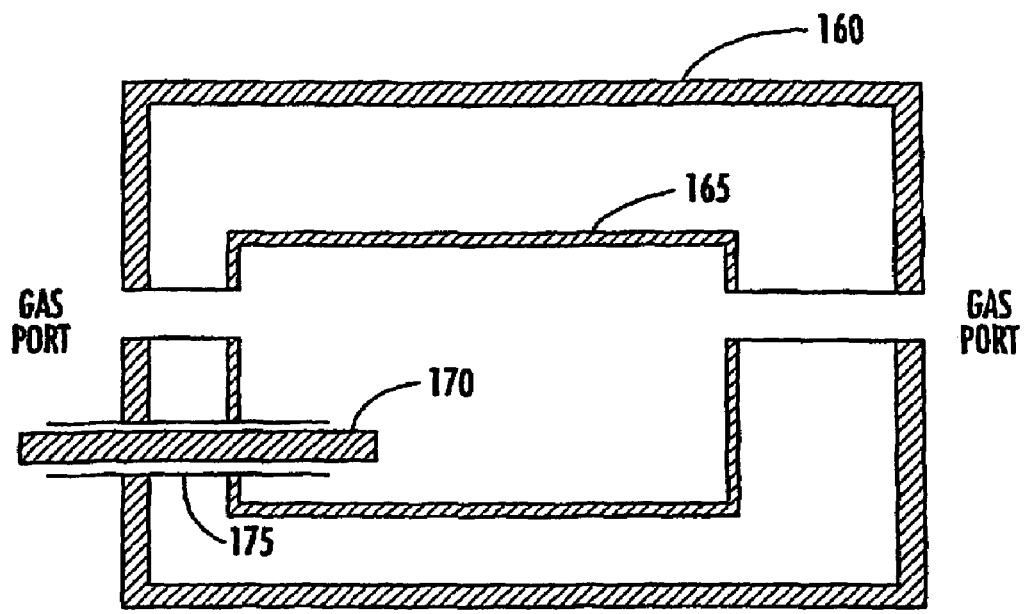
FIG. 6 shows an illustrative embodiment of another portion of a plasma system including an elongated plasma catalyst that extends through an ignition port consistent with this invention.
Figure 7:
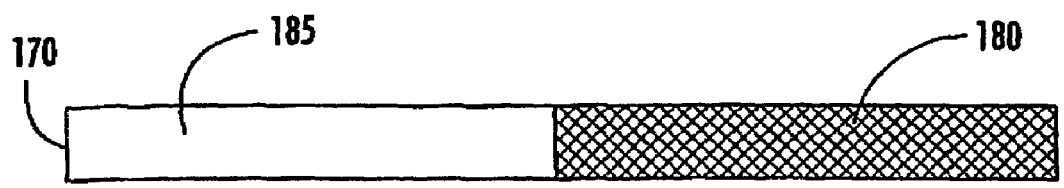
FIG. 7 shows an illustrative embodiment of an elongated plasma catalyst that can be used in the system of FIG. 6 consistent with this invention.

FIG. 6, for example, shows electromagnetic radiation chamber 160 in which plasma cavity 165 can be placed. Plasma catalyst 170 can be elongated and extends through ignition port 175. As shown in FIG. 7, and consistent with this invention, catalyst 170 can include electrically conductive distal portion 180 (which is placed in chamber 160) and electrically non-conductive portion 185 (which is placed substantially outside chamber 160, but may extend somewhat into the chamber). This configuration prevents an electrical connection (e.g., sparking) between distal portion 180 and chamber 160.

Figure 8:
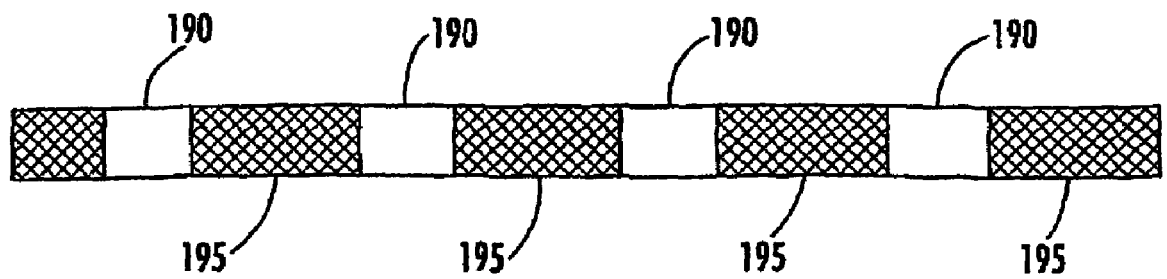
FIG. 8 shows another illustrative embodiment of an elongated plasma catalyst that can be used in the system of FIG. 6 consistent with this invention.

In another embodiment, shown in FIG. 8, the catalyst can be formed from a plurality of electrically conductive segments 190 separated by and mechanically connected to a plurality of electrically non-conductive segments 195. In this embodiment, the catalyst can extend through the ignition port between a point inside the cavity and another point outside the cavity, but the electrically discontinuous profile significantly prevents sparking and energy leakage.

Another method of forming a coating plasma consistent with this invention includes subjecting a gas in a cavity to electromagnetic radiation having a frequency less than about 333 GHz in the presence of an active plasma catalyst, which generates or includes at least one ionizing particle.

An active plasma catalyst consistent with this invention can be any particle or high energy wave packet capable of transferring a sufficient amount of energy to a gaseous atom or molecule to remove at least one electron from the gaseous atom or molecule in the presence of electromagnetic radiation. Depending on the source, the ionizing particles can be directed into the cavity in the form of a focused or collimated beam, or they may be sprayed, spewed, sputtered, or otherwise introduced.

Figure 9:
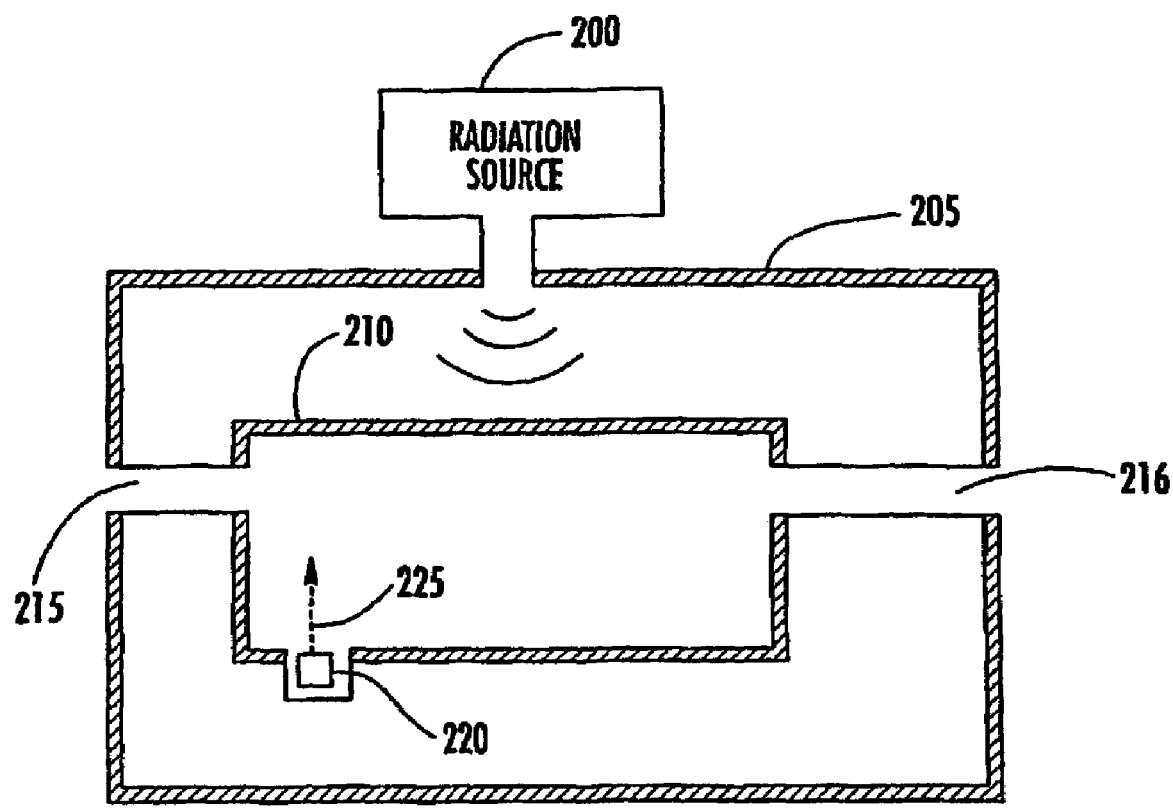
FIG. 9 shows an illustrative embodiment of a portion of a plasma system for directing an active plasma catalyst, in the form of ionizing radiation, into a radiation chamber consistent with this invention.

For example, FIG. 9 shows electromagnetic radiation source 200 directing radiation into electromagnetic radiation chamber 205. Plasma cavity 210 can be positioned inside of chamber 205 and may permit a gas to flow therethrough via ports 215 and 216. Source 220 can direct ionizing particles 225 into cavity 210. Source 220 can be protected by a metallic screen which allows the ionizing particles to go through, but shields source 220 from electromagnetic radiation. If necessary, source 220 can be water-cooled.

Examples of ionizing particles consistent with this invention can include x-ray particles, gamma ray particles, alpha particles, beta particles, neutrons, protons, and any combination thereof. Thus, an ionizing particle catalyst can be charged (e.g., an ion from an ion source) or uncharged and can be the product of a radioactive fission process. In one embodiment, the vessel in which the plasma cavity is formed could be entirely or partially transmissive to the ionizing particle catalyst. Thus, when a radioactive fission source is located outside the cavity, the source can direct the fission products through the vessel to ignite the plasma. The radioactive fission source can be located inside the electromagnetic radiation chamber to substantially prevent the fission products (i.e., the ionizing particle catalyst) from creating a safety hazard.

In another embodiment, the ionizing particle can be a free electron, but it need not be emitted in a radioactive decay process. For example, the electron can be introduced into the cavity by energizing the electron source (such as a metal), such that the electrons have sufficient energy to escape from the source. The electron source can be located inside the cavity, adjacent the cavity, or even in the cavity wall. It will be appreciated by those of ordinary skill in the art that the any combination of electron sources is possible. A common way to produce electrons is to heat a metal, and these electrons can be further accelerated by applying an electric field.

In addition to electrons, free energetic protons can also be used to catalyze a plasma. In one embodiment, a free proton can be generated by ionizing hydrogen and, optionally, accelerated with an electric field.

Multi-Mode Electromagnetic Radiation Cavities

An electromagnetic radiation waveguide, cavity, or chamber is designed to support or facilitate propagation of at least one electromagnetic radiation mode. As used herein, the term "mode" refers to a particular pattern of any standing or propagating electromagnetic wave that satisfies Maxwell's equations and the applicable boundary conditions (e.g., of the cavity). In a waveguide or cavity, the mode can be any one of the various possible patterns of propagating or standing electromagnetic fields. Each mode is characterized by its frequency and polarization of the electric field and/or magnetic field vectors. The electromagnetic field pattern of a mode depends on the frequency, refractive indices or dielectric constants, and waveguide or cavity geometry.

A transverse electric (TE) mode is one whose electric field vector is normal to the direction of propagation. Similarly, a transverse magnetic (TM) mode is one whose magnetic field vector is normal to the direction of propagation. A transverse electric and magnetic (TEM) mode is one whose electric and magnetic field vectors are both normal to the direction of propagation. A hollow metallic waveguide does not typically support a normal TEM mode of electromagnetic radiation propagation. Even though electromagnetic radiation appears to travel along the length of a waveguide, it may do so only by reflecting off the inner walls of the waveguide at some angle. Hence, depending upon the propagation mode, the electromagnetic radiation may have either some electric field component or some magnetic field component along the axis of the waveguide (often referred to as the z-axis).

The actual field distribution inside a cavity or waveguide is a superposition of the modes therein. Each of the modes can be identified with one or more subscripts (e.g., $TE_{10}$ ("tee ee one zero"). The subscripts normally specify how many "half waves" at the guide wavelength are contained in the x and y directions. It will be appreciated by those skilled in the art that the guide wavelength can be different from the free space wavelength because electromagnetic radiation propagates inside the waveguide by reflecting at some angle from the inner walls of the waveguide. In some cases, a third subscript can be added to define the number of half waves in the standing wave pattern along the z-axis.

For a given electromagnetic radiation frequency, the size of the waveguide can be selected to be small enough so that it can support a single propagation mode. In such a case, the system is called a single-mode system (i.e., a single-mode applicator). The $TE_{10}$ mode is usually dominant in a rectangular single-mode waveguide.

As the size of the waveguide (or the cavity to which the waveguide is connected) increases, the waveguide or applicator can sometimes support additional higher order modes forming a multi-mode system. When many modes are capable of being supported simultaneously, the system is often referred to as highly moded.

A simple, single-mode system has a field distribution that includes at least one maximum and/or minimum. The magnitude of a maximum largely depends on the amount of electromagnetic radiation supplied to the system. Thus, the field distribution of a single mode system is strongly varying and substantially non-uniform.

Unlike a single-mode cavity, a multi-mode cavity can support several propagation modes simultaneously, which, when superimposed, results in a complex field distribution pattern. In such a pattern, the fields tend to spatially smear and, thus, the field distribution usually does not show the same types of strong minima and maxima field values within the cavity. In addition, as explained more fully below, a mode-mixer can be used to "stir" or "redistribute" modes (e.g., by mechanical movement of an electromagnetic radiation reflector). This redistribution desirably provides a more uniform time-averaged field (and therefore plasma) distribution within the cavity.

A multi-mode cavity consistent with this invention can support at least two modes, and may support many more than two modes. Each mode has a maximum electric field vector. Although there may be two or more modes, one mode may be dominant and has a maximum electric field vector magnitude that is larger than the other modes. As used herein, a multi-mode cavity may be any cavity in which the ratio between the first and second mode magnitudes is less than about 1:10, or less than about 1:5, or even less than about 1:2. It will be appreciated by those of ordinary skill in the art that the smaller the ratio, the more distributed the electric field energy between the modes, and hence the more distributed the electromagnetic radiation energy is in the cavity.

The distribution of a coating plasma within a cavity may strongly depend on the distribution of the applied electromagnetic radiation. For example, in a pure single mode system, there may only be a single location at which the electric field is a maximum. Therefore, a strong plasma may only form at that single location. In many applications, such a strongly localized plasma could undesirably lead to non-uniform plasma treatment or heating (i.e., localized overheating and underheating).

Whether or not a single or multi-mode cavity is used consistent with this invention, it will be appreciated by those of ordinary skill in the art that the cavity in which the plasma is formed can be completely closed or partially open. For example, in certain applications, such as in plasma-assisted furnaces, the cavity could be entirely closed. See, for example, commonly owned, concurrently filed PCT Application U.S. 03/14133, now expired, which is fully incorporated herein by reference.

In other applications, however, it may be desirable to flow a gas through the cavity, and therefore the cavity must be open to some degree. In this way, the flow, type, and pressure of the flowing gas can be varied over time. This may be desirable because certain gases with lower ionization potentials, such as argon, are easier to ignite but may have other undesirable properties during subsequent plasma processing.

Mode-Mixing

For many applications, a cavity containing a uniform plasma is desirable. However, because electromagnetic radiation can have a relatively long wavelength (e.g., in the case of microwave radiation, several tens of centimeters), obtaining a uniform distribution can be difficult to achieve. As a result, consistent with one aspect of this invention, the radiation modes in a multi-mode cavity can be mixed, or redistributed, over a period of time. Because the field distribution within the cavity must satisfy all of the boundary conditions set by the inner surface of the cavity, those field distributions can be changed by changing the position of any portion of that inner surface.

In one embodiment consistent with this invention, a movable reflective surface can be located inside the electromagnetic radiation cavity. The shape and motion of the reflective surface should, when combined, change the inner surface of the cavity during motion. For example, an "L" shaped metallic object (i.e., "mode-mixer") when rotated about any axis will change the location or the orientation of the reflective surfaces in the cavity and therefore change the electromagnetic radiation distribution therein. Any other asymmetrically shaped object can also be used (when rotated), but symmetrically shaped objects can also work, as long as the relative motion (e.g., rotation, translation, or a combination of both) causes some change in the location or orientation of the reflective surfaces. In one embodiment, a mode-mixer can be a cylinder that can be rotated about an axis that is not the cylinder's longitudinal axis.

Each mode of a multi-mode cavity may have at least one maximum electric field vector, but each of these vectors could occur periodically across the inner dimension of the cavity. Normally, these maxima are fixed, assuming that the frequency of the electromagnetic radiation does not change. However, by moving a mode-mixer such that it interacts with the electromagnetic radiation, it is possible to move the positions of the maxima. For example, mode-mixer 38 can be used to optimize the field distribution within cavity 12 such that the plasma ignition conditions and/or the plasma sustaining conditions are optimized. Thus, once a plasma is excited, the position of the mode-mixer can be changed to move the position of the maxima for a uniform time-averaged plasma process (e.g., heating).

Thus, consistent with this invention, mode-mixing can be useful during plasma ignition. For example, when an electrically conductive fiber is used as a plasma catalyst, it is known that the fibers orientation can strongly affect the minimum plasma-ignition conditions. It has been reported, for example, that when such a fiber is oriented at an angle that is greater than 60° to the electric field, the catalyst does little to improve, or relax, these conditions. By moving a reflective surface either in or near the cavity, however, the electric field distribution can be significantly changed.

Mode-mixing can also be achieved by launching the radiation into the applicator chamber through, for example, a rotating waveguide joint that can be mounted inside the applicator chamber. The rotary joint can be mechanically moved (e.g., rotated) to effectively launch the radiation in different directions in the radiation chamber. As a result, a changing field pattern can be generated inside the applicator chamber.

Mode-mixing can also be achieved by launching radiation in the radiation chamber through a flexible waveguide. In one embodiment, the waveguide can be mounted inside the chamber. In another embodiment, the waveguide can extend into the chamber. The position of the end portion of the flexible waveguide can be continually or periodically moved (e.g., bent) in any suitable manner to launch the radiation (e.g., microwave radiation) into the chamber at different directions and/or locations. This movement can also result in mode-mixing and facilitate more uniform plasma processing (e.g., heating) on a time-averaged basis. Alternatively, this movement can be used to optimize the location of a plasma for ignition or other plasma-assisted process.

If the flexible waveguide is rectangular, a simple twisting of the open end of the waveguide will rotate the orientation of the electric and the magnetic field vectors in the radiation inside the applicator chamber. Then, a periodic twisting of the waveguide can result in mode-mixing as well as rotating the electric field, which can be used to assist ignition, modulation, or sustaining of a plasma.

Thus, even if the initial orientation of the catalyst is perpendicular to the electric field, the redirection of the electric field vectors can change the ineffective orientation to a more effective one. Those skilled in the art will appreciate that mode-mixing can be continuous, periodic, or preprogrammed.

In addition to plasma ignition, mode-mixing can be useful during subsequent plasma processing to reduce or create (e.g., tune) "hot spots" in the chamber. When an electromagnetic radiation cavity only supports a small number of modes (e.g., less than 5), one or more localized electric field maxima can lead to "hot spots" (e.g., within cavity 12). In one embodiment, these hot spots could be configured to coincide with one or more separate, but simultaneous, plasma ignitions or coating processes. Thus, in one embodiment, a plasma catalyst can be located at one or more of those ignition or coating positions.

Multi-Location Plasma Ignition

A plasma can be ignited using multiple plasma catalysts at different locations. In one embodiment, multiple fibers can be used to ignite the plasma at different points within the cavity. Such multi-point ignition can be especially beneficial when a uniform plasma ignition is desired. For example, when a coating plasma is modulated at a high frequency (i.e., tens of Hertz and higher), or ignited in a relatively large volume, or both, substantially uniform instantaneous striking and re-striking of the plasma can be improved. Alternatively, when plasma catalysts are used at multiple points, they can be used to sequentially ignite a plasma at different locations within a plasma chamber by selectively introducing the catalyst at those different locations. In this way, a plasma ignition gradient can be controllably formed within the cavity, if desired.

Also, in a multi-mode cavity, random distribution of the catalyst throughout multiple locations in the cavity increases the likelihood that at least one of the fibers, or any other passive plasma catalyst consistent with this invention, is optimally oriented with the electric field lines. Still, even where the catalyst is not optimally oriented (not substantially aligned with the electric field lines), the ignition conditions are improved.

Furthermore, because a catalytic powder can be suspended in a gas, it is believed that each powder particle may have the effect of being placed at a different physical location within the cavity, thereby improving ignition uniformity within the cavity.

Dual-Cavity Plasma Igniting/Sustaining

Figure 1B:
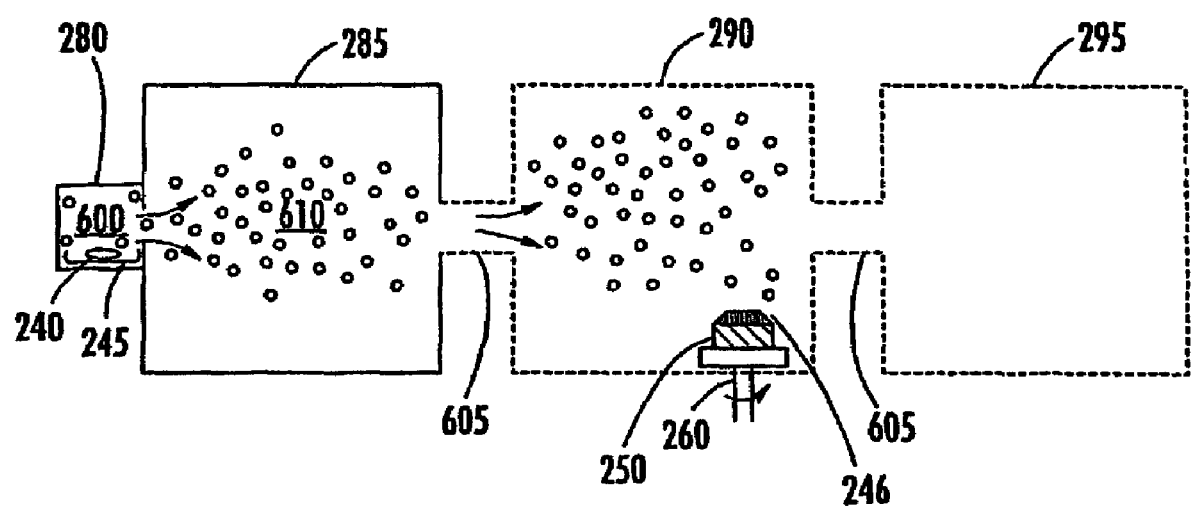
FIG. 1B shows an illustrative embodiment of a portion of the coating system shown in FIG. 1 with additional optional plasma chambers consistent with this invention.

A dual-cavity arrangement can be used to ignite and sustain a plasma consistent with this invention. In one embodiment, a system includes at least ignition cavity 280 and plasma processing cavity 285 in fluid communication with each other, for example, as shown in FIG. 1B. Cavities 280 and 285 can be located, for example, inside electromagnetic radiation chamber (i.e., applicator) 14, as shown in FIG. 1. To form an ignition plasma, a gas in first ignition cavity 280 can be subjected to electromagnetic radiation having a frequency less than about 333 GHz, optionally in the presence of a plasma catalyst. In this way, the proximity of the first and second cavities can permit plasma 600, formed in cavity 280, to ignite plasma 610 in cavity 285, which may be sustained with additional electromagnetic radiation.

Additional cavities 290 and 295 are optional, and can be kept in fluid communication with cavity 285 by channel 605, for example. An object to be coated, such as work piece 250, can be placed in any of cavities 285, 290, or 295 and can be supported by any type of supporting device, such as support 260, which optionally moves or rotates work piece 250 during the coating procedure.

In one embodiment of this invention, cavity 280 can be very small and designed primarily, or solely for plasma ignition. In this way, very little electromagnetic radiation energy may be required to ignite plasma 600, permitting easier ignition, especially when a plasma catalyst is used consistent with this invention. It will also be appreciated that the cavities used in the plasma system consistent with the present invention can have a variable size, and a deposition controller can be used to control the size of the cavity.

In one embodiment, cavity 280 can be a substantially single mode cavity and cavity 285 can be a multi-mode cavity. When cavity 280 only supports a single mode, the electric field distribution may strongly vary within the cavity, forming one or more precisely located electric field maxima. Such maxima are normally the first locations at which plasmas ignite, making them ideal points for placing plasma catalysts. It will be appreciated, however, that when a plasma catalyst is used to ignite plasma 600, the catalyst need not be placed in the electric field maximum and, many cases, need not be oriented in any particular direction.

Illustrative Coating Methods and Apparatus

FIGS. 1B-1E show various illustrative embodiments of plasma chambers that can be used to coat objects consistent with this invention. FIG. 1B, for example, already described above, shows how a dual-cavity system can be used to ignite a plasma in one chamber and form a coating plasma in another. FIG. 1B also shows how additional chambers can be added sequentially, if desired.

Figure 1C:
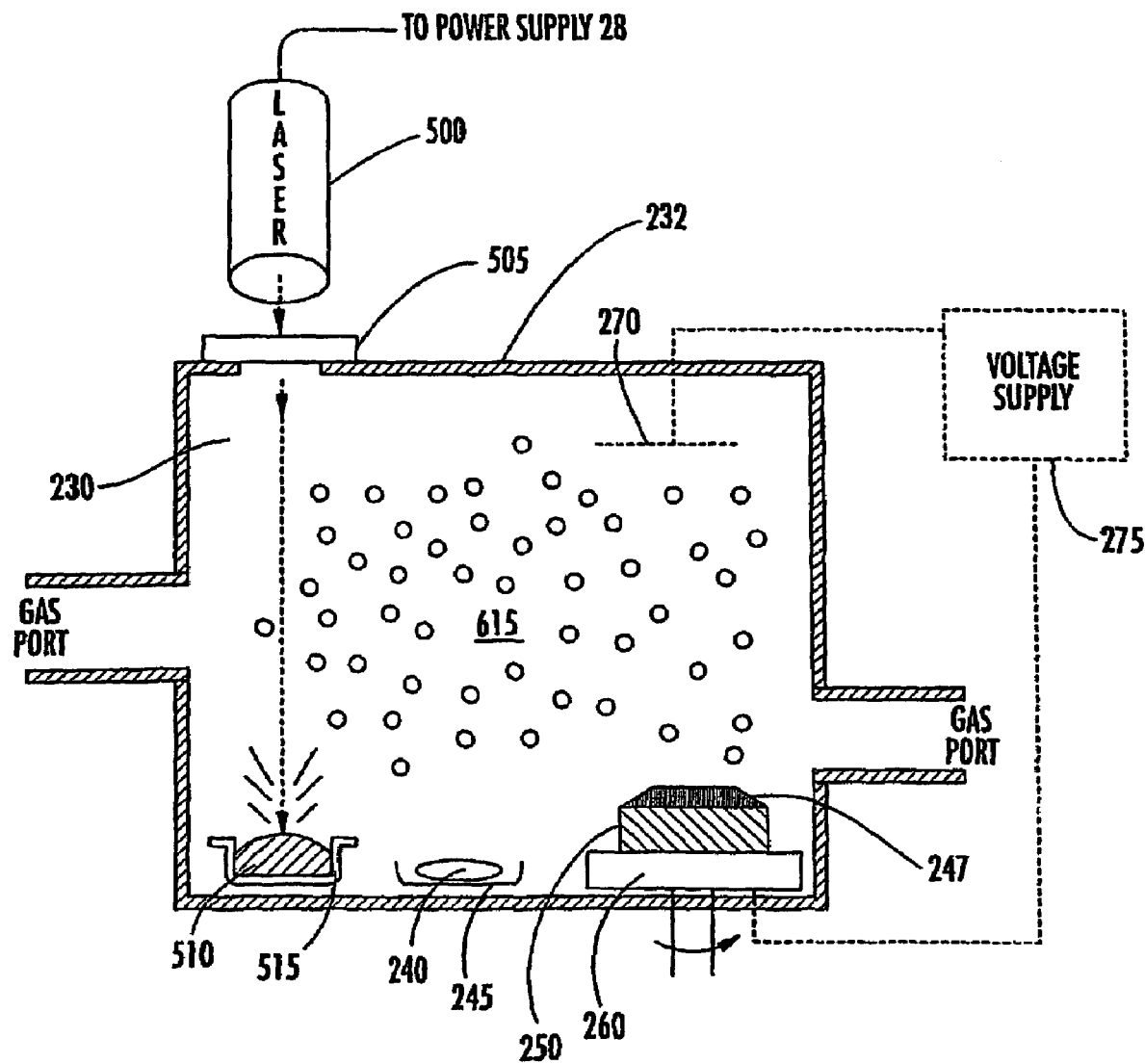
FIG. 1C shows another illustrative embodiment of a portion of the coating system shown in FIG. 1 for applying a voltage to an object to be coated including a device for energizing a coating material consistent with this invention.

FIG. 1C illustrates another embodiment in which a single cavity is used to ignite a plasma with a plasma catalyst and to coat an object. In this embodiment, a first surface area of work piece 250 can be coated by forming plasma 615 in cavity 230 by subjecting a gas to an amount of electromagnetic radiation in the presence of plasma catalyst 240, which can be located, for example, on mount 245. In addition, laser 500 can direct a laser beam through optical window 505 to energize (e.g., vaporize, sublime, or sputter) coating material 510 in crucible 515. It will be appreciated that any solid or liquid (e.g., any material that will vaporize, sublime, or sputter upon exposure to laser 500) can be used as coating material 510. It will also be appreciated that other types of energy sources, other than laser 500, can be used to energize material 510, including, for example, ion beams, carrier gases, etc.

In one embodiment, laser 500 can produce a beam of light having a wavelength between about 150 nm and 20 μm, although any other convenient wavelength can also be used. Laser 500 can also be a high peak power pulsed laser beam that continually, periodically, or in a preprogrammed fashion energizes coating material 510. A gas, such as Ar (not shown), can direct the energized (e.g., vaporized) coating material toward plasma 615 to form a coating on work piece 250. It will be appreciated that the uniformity of the coating can be increased by moving (e.g., rotating) work piece 250 using support 260 (e.g., a turntable). In addition, as described more fully below, voltage supply 275 can supply a continuous or pulsed electric bias (e.g., negative or positive, DC or AC) to work piece 250. The bias is believed to accelerate ionized atomic or molecular species of coating material 510 toward work piece 250, which may provide an improved bond between coating 247 and work piece 250, and increase deposition rates. Voltage supply 275 can apply an opposite bias to electrode 270 or to any other part of chamber 232.

Thus, coating plasma 615, which can be catalyzed from a gas using plasma catalyst 240 can be enhanced by adding coating material 510 by energizing the material with laser 500. It will be appreciated that although FIG. 1C shows a single cavity system, two or more cavities can be used consistent with this invention.

It will be appreciated by one of ordinary skill in the art that a plasma-assisted coating system consistent with this invention can include any electronic or mechanical means for introducing a catalyst to a plasma cavity. For example, a fiber can be mechanically inserted before or during the formation of the coating plasma. It will also be appreciated that plasma 600 can also be triggered by a spark plug, pulsed laser, or even by a burning match stick introduced in cavity 230 before, during, or after the presence of electromagnetic radiation.

It will be further appreciated that material 510 can be separated from plasma 615 during a coating procedure to better control the introduction of the material into the plasma. For this purpose, one or more walls or screens (not shown) can be placed between coating material 510 in crucible 515 and plasma 615. Other electromagnetic radiation or plasma shielding methods may also be used.

Plasma 615 can absorb an appropriate level of electromagnetic radiation energy to achieve any predetermined temperature profile (e.g., any selected temperature). The gas pressure in the cavity can be less than, equal to, or greater than atmospheric pressure. At least one additional coating material (not shown) can be added to plasma 615, thereby allowing it to form a multi-component coating on the surface of work piece 250.

Work piece 250 can be any object that may need a coating, such as a low carbon steel. For example, the work piece may be an automotive part, such as a brake banjo block, a cam lobe, a gear, a seat component, a rail lever, a socket fastener, or a parking brake part. Work piece 250 can also be, for example, a semiconductor substrate, a metal part, a ceramic, a glass, etc.

In one embodiment, as mentioned above, a bias can be applied to work piece 250 to produce a more uniform and rapid coating process. For example, as shown in FIG. 1C, a potential difference can be applied between electrode 270 and work piece 250 by voltage supply 275. The applied voltage can, for example, take the form of a continuous or pulsed DC or AC bias. The voltage can be applied outside applicator 14 and in combination with a microwave filter to prevent, for example, microwave energy leakage. The applied voltage may attract charged ions, energizing them, and facilitate coating adhesion and quality.

Figure 1D:
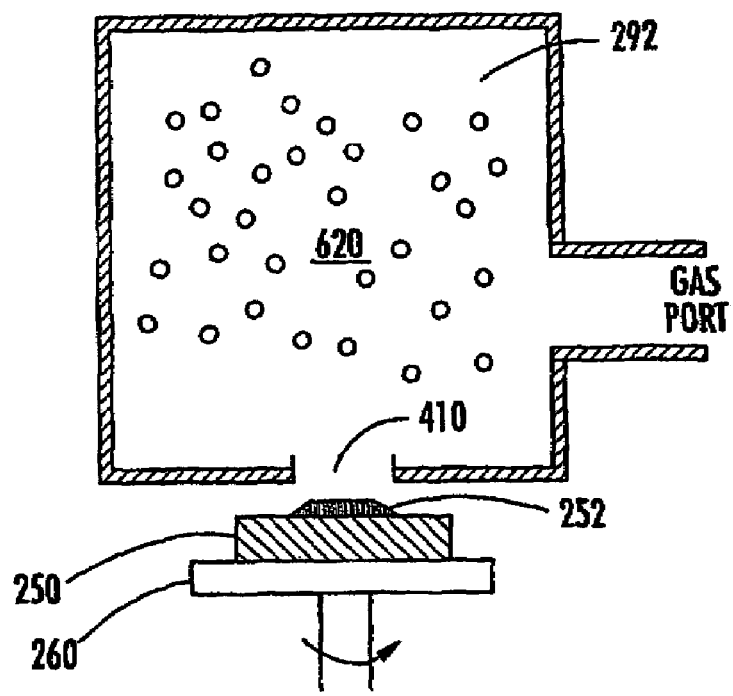
FIG. 1D shows still another illustrative embodiment of a portion of the coating system shown in FIG. 1 for coating an object through an aperture consistent with this invention.

FIG. 1D shows another embodiment consistent with this invention where the coating process takes place outside of the plasma chamber. In this case, cavity 292 has aperture 410, which may be at or near the bottom of cavity 292 to help prevent plasma 620 from escaping cavity 292. It will be appreciated, however, that aperture 410 can be located at any position of cavity 292. In this embodiment, work piece 250 can be supported by mount 260 and optionally rotated or otherwise moved with respect to aperture 410. Plasma 620 inside cavity 292 can include one or more coating materials that can be deposited on a surface of work piece 250. In this embodiment, plasma 620 can be sustained or modulated in cavity 292 and work piece 250 can be maintained at a temperature that is substantially below plasma 620.

In addition, mount 260 can be heated or cooled by any means (e.g., a heat exchanger) to keep work piece 250 at a desirable temperature. For example, a cooling fluid (e.g., gas) can be used to cool work piece 250 before, during, or after a deposition. When the temperature of work piece 250 is modified with a gas, such as with nitrogen, or by contact with a liquid, coating 252 on work piece 250 may have improved electrical, thermal, and mechanical properties.

It will be appreciated that the coating material passing through aperture 410 may be combined with one or more other materials or gases (not shown), inside or outside cavity 292, to achieve any desired coating composite or composition.

Laser 500 and coating material 510 can be part of any single cavity system (e.g. as shown in FIGS. 1A, 1C, 1D, 1E, 6, and 9) or part of a multi-cavity system (e.g., as shown in FIG. 1B). Thus, in the case of FIG. 1B, coating material 510 and crucible 515 can be placed in any of cavities 285, 290, and 295, and exposed to light emitted by laser 500.

As mentioned above, energizing (e.g., vaporizing, subliming, sputtering, etc.) coating material 510 can be accomplished by means other than laser 500. For example, coating material 510 can be exposed to a particle beam passing through window 505, where the particle beam may be a concentrated group of particles, such as electrons, protons, charged particles, photons, or any combination thereof.

Although igniting, modulating, or sustaining a coating plasma consistent with this invention and exposing coating material 510 With laser 500 can occur at atmospheric pressure, a coating can be deposited onto work piece 250 at any desirable pressure, including below, at, or above atmospheric pressure. Furthermore, plasma pressure and temperature can be varied as desired, and the deposition rate can be regulated by the strength of the energy source. For example, using a system (like the one shown in FIG. 1B) allows one to modulate or sustain coating plasma 610 at atmospheric pressure in cavity 285 while exposing a coating material to a laser in cavity 285 and deposit a coating on work piece 250 in another cavity (e.g., cavity 290 or 295) at a pressure higher or lower than atmospheric pressure. Such flexibility can be very desirable in, for example, large scale manufacturing processes.

Figure 1E:
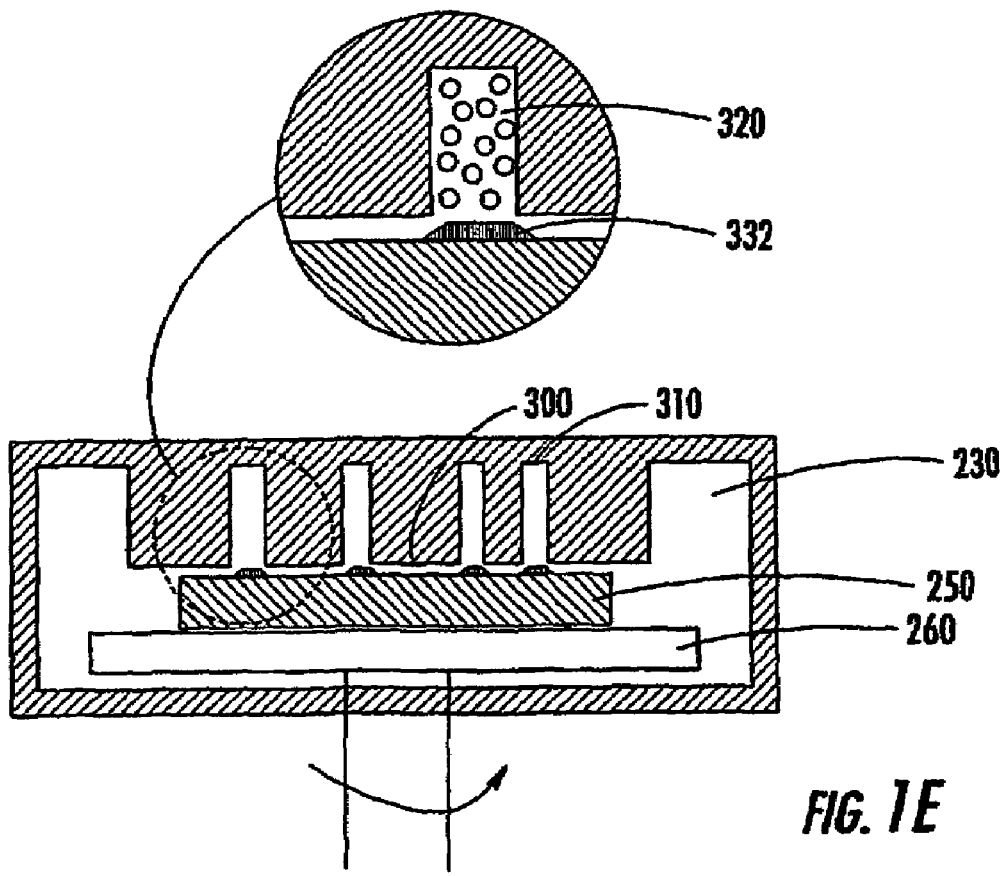
FIG. 1E shows yet another illustrative embodiment of a portion of the coating system shown in FIG. 1 where a plasma cavity has internal surface features for fabricating patterned coatings consistent with this invention.

FIG. 1E shows how an inner surface of cavity 230 can contain surface features (e.g., one or more topographical features) to form a patterned coating on work piece 250. For a metallic work piece, plasma 320 can be modulated or sustained, for example, at predetermined locations above the surface of work piece 250 by providing a sufficient gap between that surface and the inner surface of cavity 230. For example, plasma 320 can be formed, and a coating can be deposited adjacent to plasma 320, when the gap is at least about $\lambda/4$, where $\lambda$ is the wavelength of the applied electromagnetic radiation. On the other hand, when the gap is less than $\lambda/4$, no plasma will form and a significant coating may not be deposited. It will be appreciated that plasma 320 can include a coating material resulting from exposure to laser light, allowing a coating to form adjacent to surface 310. Thus, coating 332 can be deposited in gaps where plasmas can form but can be substantially prevented where plasma is prevented.

Since the plasma may not be sustained in a region with a gap less than about $\lambda/4$ (below, e.g., surface 300), a coating may not deposit there. On the other hand, the plasma may be sustained below surface 310, and a coating may be deposited there. It will be appreciated that the pattern shown in FIG. 1E is not the only possible pattern, and that a device for energizing a coating material (e.g., a laser) can be located in, near, adjacent to, or otherwise in fluid communication with, cavity 230.

It will also be appreciated that the plasma-formation dependency on wavelength results from the boundary conditions imposed by electrically-conductive surfaces, such as an inner metallic surface of a cavity. When non-metallic surfaces are used, the size of the local plasma volume can be increased or decreased beyond the $\lambda/4$. In general, controlling the plasma volume in the proximity of a coating surface can be used to control the energy flux delivered to that surface by the plasma and any resulting plasma-assisted coating process.

Although FIG. 1E shows the inner surface of cavity 230 with raised and depressed surface features, it will be appreciated that these features can be located on work piece 250, and the inner surface of cavity 230 can be relatively flat or smooth.

Surface features present on work piece 250 can effectively act like a mask during deposition of the coating material described previously. This "mask" can be the work piece itself, or it can be a photo resist, for example, like that used in the semiconductor industry, or it can be any other material used to alter the deposition process (e.g., a sacrificial film designed to prevent coating on the sides of a gear, for example, thereby allowing the coating to deposit only on the gear teeth). Masks, for example, can be negative or positive photo resists, deposited metals, oxides, or other materials used in a permanent or sacrificial manner to effectuate a desired coating pattern.

Whether or not a pattern is desired, one or more components can be added to the plasma for deposition on work piece 250. The coating materials (i.e., components) added to the plasma can be provided using a nitrogen source, an oxygen source, a carbon source, an aluminum source, an arsenic source, a boron source, chromium source, a gallium source, a germanium source, an indium source, a phosphorous source, a magnesium source, a silicon source, a tantalum source, a tin source, a titanium source, a tungsten source, a yttrium source, a zirconium source, and any combination thereof. Such a source can be a pure elemental source, but can also be a combination of one or more elements, including, for example, any carbide, oxide, nitride, phosphide, arsenide, boride, and any combination thereof.

In addition, other materials can be used, such as tungsten carbide, tungsten nitride, tungsten oxide, tantalum nitride, tantalum oxide, titanium oxide, titanium nitride, silicon oxide, silicon carbide, silicon nitride, aluminum oxide, aluminum nitride, aluminum carbide, boron nitride, boron carbide, boron oxide, gallium phosphide, aluminum phosphide, chromium oxide, tin oxide, yttria, zirconia, silicon-germanium, indium tin oxide, indium gallium arsenide, aluminum gallium arsenide, boron, chromium, gallium, germanium, indium, phosphorous, magnesium, silicon, tantalum, tin, titanium, tungsten, yttrium, and zirconium. Again, many other materials can also be formed, depending on the source materials.

When deposited, the materials provided by these sources can form nearly any type of coating, which may be deposited on nearly any substrate. For example, carbides, nitrides, borides, oxides, and other materials can be synthesized and deposited on a substrate consistent with this invention, including various combinations, such as silicon carbide (SiC), titanium carbide (TiC), titanium carbon nitride (TiCN), titanium aluminum nitride (TiAlN), titanium boron nitride (TiBN), chromium nitride (CrN), tungsten carbide (WC), aluminum nitride (AlN), silicon nitride ($Si_3N_4$), titanium diboride ($TiB_2$), cubic-boron nitride (cBN), boron carbide ($B_4C$), alumina ($Al_2O_3$), boron oxide, and diamond. Other materials mentioned previously may also be synthesized, including any combination of the materials listed above. It will be appreciated that hydrogen may also be added to the plasma to reduce the formation of oxides.

Thus, consistent with this invention, one or more components can be added to a catalyzed plasma and then deposited on a substrate to form coatings, including powders.

For example, to form SiC, a source of silicon (e.g., any organosilane precursor, such as $SiCl_4$, $SiH_4$, $SiF_4$, $SiH_2Cl_2$, or any combination thereof) and any carbon source (e.g., a hydrocarbon, such as alcohol, propane, ethane, methane, as well as carbon powder, fiber, vapor, etc.) can be added to the plasma. Some of the many possible organosilane precursors include trimethylsilane, tetramethylsilane, and silacyclobutane. Silane gas can also be used as a source of silicon. Also consistent with this invention, it will be appreciated that a source of SiC (e.g., used as a coating material) can be exposed to a laser to selectively energize the SiC so that it can be added to the plasma and deposited as a coating on work piece 250.

An advantage of depositing coatings, like those described above, using this catalyzed plasma process may include a higher growth rate due to the very high concentration of species that may exist above work piece 250 during coating, even at relatively high pressures. Also, it is believed that the number of pinholes formed in the coating using this invention will be reduced compared with conventional chemical vapor deposition techniques. It will be appreciated that SiC thin films fabricated with this invention can be used, for example, in making high-temperature electronic chips, or in providing high-strength coatings for automotive and other types of parts.

It will also be appreciated that other high-strength coatings can be formed consistent with this invention using the plasma system described herein. To form TiC, for example, a source of titanium (e.g., $TiCl_4$, $TiO_2$, and any combination thereof) and any carbon source (e.g., see above) can be added to the plasma. An appropriate amount of hydrogen can also be added, such as about 10% by volume to prevent oxidation. The cavity temperature can be operated at any convenient temperature, such as between about 1,000 degrees Celsius and about 1,200 degrees Celsius. In a similar fashion, WC can be formed using a source of W (e.g., tungsten oxide, tungsten fluoride, and any combination thereof) and a source of carbon (e.g., see above).

In addition to TiC and WC, other coatings, including Ti, Cr, and/or Si, are also possible. To form TiN, for example, a source of titanium (e.g., see above) and any nitrogen source (e.g., $N_2$, $NH_3$, and any combination thereof) can be added to the plasma. Once again, the cavity temperature can be held at any convenient temperature, such as between about 1,000 degrees Celsius and about 1,200 degrees Celsius although other temperatures can be used. Similarly, to form TiCN, a source of titanium (e.g., see above), a carbon source (e.g., see above), and a nitrogen source (e.g., see above) can be added to the plasma.

Furthermore, to form TiAlN, for example, a source of titanium (e.g., see above), a source of aluminum (e.g., $AlCl_3$, trimethylaluminum, elemental aluminum (e.g., powder), etc.), and any nitrogen source (e.g., see above) can be added to a plasma. Also, to form TiBN, a source of titanium (e.g., see above), a source of boron (e.g., $BCl_3$, $NaBH_4$, $(CNBH_2)_n$, and any combination thereof) and any nitrogen source (e.g., see above) can be added to the plasma. Further, to form CrN, a source of Cr (e.g., atomic Cr) and any source of nitrogen (e.g., see above) can be added to a plasma. Moreover, to form AlN, a source of Al (e.g., see above) and any source of nitrogen (e.g., see above) can be added to the plasma. In addition, to form $Si_3N_4$, a source of silicon (e.g., see above) and any source of nitrogen (e.g., see above) can be added to a plasma. It will be appreciated that silicon nitride can be used, for example, for many applications that require increased strength or improved optical properties.

Various borides and oxides can also be deposited consistent with this invention. For example, to form $TiB_2$, a source of titanium (e.g., $TiCl_4$, $TiO_2$, and any combination thereof) and a source of boron (e.g., see above) can be added to the plasma. Hydrogen and/or trichloroethane can also be added to the plasma in suitable quantities to improve yields. To form cBN, a source of boron (e.g., see above) and any nitrogen source (see above) can be added to the plasma. Also, to form $B_4C$, a source of boron (e.g., see above) and any carbon source (e.g., see above) can be added to the plasma. $B_4C$, for example, can be used to coat tool bits. To form $Al_2O_3$, a source of Al (e.g., see above) and any source of oxygen, including pure oxygen, can be added to the plasma. To encourage oxidation, hydrogen may not be desirable for this reaction. It will be appreciated that other oxides can be synthesized in a similar manner.

In addition to the many exemplary alloys discussed above, carbon films, such as diamond films, can be synthesized consistent with this invention. To form diamond, a source of carbon (e.g., a hydrocarbon or carbon powder or fiber) can be added to the plasma. By adding hydrogen to the plasma, formation of graphite can be substantially suppressed and formation of diamond can be encouraged. For example, a combination of $CH_4$, $H_2$, Ar, and carbon fibers in the presence of a nickel catalyst (e.g., in the form of a plate) with a cavity temperature at about 600 degrees Celsius can be used to form diamond. Ni powder, for example, can also be used as catalyst.

It will be appreciated that other single and multi-element coatings not discussed above can also be formed consistent with this invention.

In the foregoing described embodiments, various features are grouped together in a single embodiment for purposes of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description of Embodiments, with each claim standing on its own as a separate preferred embodiment of the invention.

We claim:

1. A method of coating a first surface area of an object, comprising:

forming a plasma in a first cavity by subjecting a gas to an amount of electromagnetic radiation having a wavelength λ in the presence of a plasma catalyst, wherein the cavity is formed in a vessel having an inner surface;

placing at least one coating material in a position that is separate from the plasma and in fluid communication therewith;

energizing a portion of the at least one coating material so that the energized portion can be added to the plasma;

positioning a first portion of the object to be coated at a distance of at least about λ/4 from a first portion of the inner surface of the vessel; and allowing the at least one material to deposit on the surface area of the object to form a coating, wherein the at least one coating material is placed at a distance of less than about λ/4 from a second portion of the inner surface of the vessel.

2. The method of claim 1, wherein the plasma catalyst is at least one of a passive plasma catalyst and an active plasma catalyst.

3. The method of claim 2, wherein the catalyst comprises at least one of metal, inorganic material, carbon, carbon-based alloy, carbon-based composite, electrically conductive polymer, conductive silicone elastomer, polymer nanocomposite, and an organic-inorganic composite.

4. The method of claim 3, wherein the catalyst is in the form of at least one of a nano-particle, a nano-tube, a powder, a dust, a flake, a fiber, a sheet, a needle, a thread, a strand, a filament, a yarn, a twine, a shaving, a sliver, a chip, a woven fabric, a tape, and a whisker.

5. The method of claim 4, wherein the catalyst comprises carbon fiber.

6. The method of claim 2, wherein the catalyst is in the form of at least one of a nano-particle, a nano-tube, a powder, a dust, a flake, a fiber, a sheet, a needle, a thread, a strand, a filament, a yarn, a twine, a shaving, a sliver, a chip, a woven fabric, a tape, and a whisker.

7. The method of claim 2, wherein the catalyst comprises at least one electrically conductive component and at least one additive in a ratio, the method further comprising sustaining the plasma, wherein the sustaining comprises:
  directing additional electromagnetic radiation into the cavity; and
  allowing the catalyst to be consumed by the plasma such that the plasma contains the at least one additive.

8. The method of claim 1, wherein the radiation has a frequency less than about 333 GHz, and wherein the plasma catalyst includes an active plasma catalyst comprising at least one ionizing particle.

9. The method of claim 8, wherein the at least one ionizing particle comprises a beam of particles.

10. The method of claim 1, wherein the plasma is formed at a pressure at least about 1 atmosphere.

11. The method of claim 1, wherein the placing comprises placing the at least one coating material in the cavity before the energizing.

12. The method of claim 11, wherein the placing comprises placing the at least one coating material into an open container within the cavity, wherein the container substantially shields the electromagnetic radiation from the coating material during the allowing.

13. The method of claim 11, wherein the placing comprises placing the at least one coating material in a portion of the cavity in which there is relatively less electromagnetic radiation compared with another portion at which the plasma is formed.

14. The method of claim 1, wherein the energizing comprises directing a beam of light onto the at least one coating material.

15. The method of claim 14, wherein the beam of light has a wavelength between about 150 nm and about 20 µm.

16. The method of claim 1, wherein the energizing comprises directing a particle beam onto the at least one coating material.

17. The method of claim 16, wherein the particle beam comprises a plurality of particles selected from a group consisting of electrons, protons, neutrons, charged particles, photons, and any combination thereof.

18. The method of claim 1, further comprising sustaining the plasma during the allowing by directing a sufficient amount of electromagnetic radiation power into the cavity, wherein the directing is selected from a group consisting of continuously directing, periodically directing, programmed directing, and any combination thereof.

19. The method of claim 18, further comprising controlling a temperature associated with the plasma according to a predetermined temperature profile by varying at least one of a gas flow through the cavity and an electromagnetic radiation power level.

20. The method of claim 18, further comprising cooling the object by at least one of flowing a cooling gas across the object, reducing the electromagnetic radiation power in the cavity, and circulating a fluid adjacent to the object.

21. The method of claim 1, wherein the cavity substantially confines the plasma during the allowing.

22. The method of claim 1, wherein a second cavity is connected to the first cavity, the method further comprising:
  placing the object in the second cavity;
  sustaining the plasma in the first cavity during the allowing; and
  flowing the at least one coating material from the first cavity into the second cavity, thereby permitting the coating to form on the object in the second cavity.

23. The method of claim 1, wherein the first cavity is formed in a vessel that has an aperture, the method further comprising:
  placing the object outside the first cavity near the aperture;
  sustaining the plasma in the first cavity during the allowing; and
  flowing the at least one coating material from the first cavity through the aperture to form a coating on the object.

24. The method of claim 1, wherein the cavity has a variable size, the method further comprising varying the size of the cavity.

25. The method of claim 1, wherein an electric bias is applied to the object such that the bias is selected from a group consisting of direct current bias, pulsed positive direct current bias, and pulsed negative direct current bias.

26. A method of coating a first surface area of an object, comprising:
  forming a plasma in a first cavity by subjecting a gas to an amount of electromagnetic radiation in the presence of a plasma catalyst, wherein the cavity is formed in a vessel having an interior surface with at least one surface feature;
  placing at least one coating material in a position that is separate from the plasma and in fluid communication therewith;
  energizing a portion of the at least one coating material so that the energized portion can be added to the plasma; and
  allowing the at least one material to deposit on the surface area of the object to form a coating, pattern on the object based on the at least one surface feature.

* * * * *

UNITED STATES PATENT AND TRADEMARK OFFICE
CERTIFICATE OF CORRECTION

PATENT NO.        : 7,498,066 B2
APPLICATION NO.   : 10/513393
DATED             : March 3, 2009
INVENTOR(S)       : Devendra Kumar et al.

It is certified that error appears in the above-identified patent and that said Letters Patent is hereby corrected as shown below:

Column 17, line 13, "With" should read --with--;

Column 18, line 47, "(T:A1N)" should read --(T:AIN)--;

Column 18, line 49, "(A1N)" should read --(AIN)--;

Column 19, line 40, "TiA1N" should read --TiAIN--; and

Column 19, line 49, "A1N" should read --AIN--.

Signed and Sealed this

Twenty-second Day of September, 2009

David J. Kappos
*Director of the United States Patent and Trademark Office*